United States Patent [19]

Suzuki et al.

[11] 4,093,942
[45] June 6, 1978

[54] MATRIX CIRCUITS

[75] Inventors: Yasoji Suzuki, Kanagawa; Yoshio Kaneko, Kawasaki; Yoshihisa Shiotari, Yokohama, all of Japan

[73] Assignee: Tokyo Shibaura Electric Co., Ltd., Tokyo, Japan

[21] Appl. No.: 693,121

[22] Filed: Jun. 4, 1976

[30] Foreign Application Priority Data

Jun. 5, 1975 Japan .................................. 50-67870
Jun. 20, 1975 Japan .................................. 50-74375
Jun. 25, 1975 Japan .................................. 50-77563

[51] Int. Cl.$^2$ ............................................. H04Q 3/00
[52] U.S. Cl. ............................ 340/166 R; 340/147 R
[58] Field of Search ................... 340/166 R; 307/205, 307/215, 251, 304; 179/18 GF

[56] References Cited

U.S. PATENT DOCUMENTS

| | | | |
|---|---|---|---|
| 3,551,900 | 12/1970 | Annis ............................. | 340/166 R |
| 3,566,153 | 2/1971 | Spencer .......................... | 340/166 R |
| 3,624,609 | 11/1971 | Weckler ......................... | 340/166 R |
| 3,639,908 | 2/1972 | Hovagimyan .................. | 340/166 X |

Primary Examiner—Harold I. Pitts
Attorney, Agent, or Firm—Finnegan, Henderson, Farabow & Garrett

[57] ABSTRACT

A matrix circuit acting as a read only memory (ROM) comprises first and second groups of input lines, a third group of input lines arranged between the first and second groups of input lines, a plurality of groups of output lines intersecting the input lines off the first, second and third group, each group of the output lines having one terminal commonly connected in a wired OR fasion to one end of a power source and having the other terminal commonly connected to the ground. A plurality of first switching elements are respectively connected to the output lines and selectively driven by an input signal supplied to the first group of the input lines, a plurality of second switching elements driven by the same input signal as that supplied to the first switching elements and respectively connected to the output lines each lying adjacent to the output lines connected with the first switching elements, and a plurality of third switching elements respectively connected between the adjacent output lines and selectively driven by an input signal supplied to the third group of input lines.

6 Claims, 29 Drawing Figures $\begin{cases} a = 48\mu \\ b = 28\mu \end{cases}$

8OR-1 OUTPUT

MATRIX CIRCUITS

BACKGROUND OF THE INVENTION

1. Field of the Invention

This invention relates to a matrix circuit capable of manufacturing with integrated circuits and decreasing the area occupying the surface of a semiconductor chip.

2. Description of the Prior Art

Although the number of the operation steps of a table type electronic computer or the like is generally different depending upon the operation function thereof, 64, 128, 256 and 512 steps are used in most cases. In the case of a computer, the term step is used to mean an address representing a calculating operation. Thus, the steps are addresses that determine the operations to be performed in respective steps. For example, the setting of an operand is made in the first step, the set operand is entered in an operational register in the second step, the operand is set in the third step, and so on.

In a memory device, the steps correspond to addresses that determines the informations to be stored. For the sake of description, a 512 step control gate, or a read only memory device (ROM) will be taken as an example of the matrix circuit.

As shown in FIG. 1, a control gate (ROM) having 512 steps has been constructed to produce 512 outputs by decoding $2^9$ control signals or a control signal having 9 inputs and to use 512 outputs as the control signals for performing desired calculating operations. Assuming now that 24 control signals are necessary for a desired operation, a matrix circuit or a ROM is constituted by 512 input conductors arranged in the direction of Y axis and 24 output conductors arranged in the direction of X axis as shown in FIG. 1. Suppose now that wired OR gate circuits (gate circuits constituted by P channel field effect transistors) are used to constitute the ROM, that a grounded conductor is commonly used for two output conductors as shown in FIG. 2, and that each field effect transistor comprises an aluminum gate (although a polysilicon gate can also be used). With the ROM of this construction, when one bit has a dimension of 24 $\mu$ × 28 $\mu$, a pattern of the ROM as shown in FIG. 3 will be obtained. Since $a = 48 \mu$, and $b = 28 \mu$, the dimension in the direction of Y axis is 28 $\mu$ × 512 = 14336 $\mu$ and that in the direction of X axis is 48 $\mu$ × 24/2 = 576 $\mu$. Although the area occupied by the ROM is about 8.258 mm², the dimension in the direction of Y axis is extremely large, that is 14336 $\mu$, thus rendering it difficult to fabricate the circuit with integrated circuits by mass production technique.

Many efforts have been made to make equal or comparable as far as possible the lengths of the sides of the matrix circuit. According to one approach, 9 inputs of the 512 step ROM described above is divided into 3 inputs and 6 inputs, namely 8 steps and 64 steps, and 8 OR gate circuits are used to obtain one output. FIG. 4 is a diagram showing one example of the ROM according to this method. FIG. 5a shows the detail of the circuit for one output, and FIG. 5b shows a portion of the circuit pattern. In this construction, the ROM operates to obtain the product between an 8 step control signal and a 64 step control signal and so that the output has 512 steps which is sufficient to produce desired control signals. The reason for this will be described hereunder by taking 32 steps as an example.

In FIG. 6 which corresponds in principle to FIG. 1, suppose now that an output $O_1$ is expressed by the following equation:

$$O_1 = \overline{\overline{12} \cdot \overline{13} \cdot \overline{14} \cdot \overline{15}}$$

$$= 12 + 13 + 14 + 15$$

$$= \overline{A}BCD\overline{E} + A\overline{B}CD\overline{E} + \overline{A}BCDE + ABCD\overline{E} \quad (1)$$

Output $O_1$ can be modified as follows 2)

$$O_1 = CD\overline{E}(\overline{A}\overline{B} + A\overline{B} + \overline{A}B + AB) \quad (2)$$

Accordingly, decoders respectively having two inputs A and B, and three inputs C, D and E may be used to form required logical operations by a ROM. FIG. 7 shows such a ROM and the detail of the circuit thereof is shown in FIG. 8. Thus, $$O_1 = (3' + \overline{0})(3' + \overline{1})(3' + \overline{2})(3' + \overline{3})$$

$$= 3' \cdot 0 + 3' \cdot 1 + 3' \cdot 2 + 3' \cdot 3$$

$$= 3'(0 + 1 + 2 + 3) \quad (3)$$

Since $3' = CD\overline{E}$, $0 = \overline{A}\overline{B}$, $1 = A\overline{B}$, $2 = \overline{A}B$ and $3 = AB$, equation (3) can be rewritten as follows $$O_1 = CD\overline{E}(\overline{A}\overline{B} + A\overline{B} + \overline{A}B + AB) \quad (4)$$

Thus, equation (3) is identical to equation (2).

Output $O_2$ can be expressed similarly. Thus, in FIG. 6

$$O_2 = \overline{\overline{0} \cdot \overline{13} \cdot \overline{22} \cdot \overline{27}}$$

$$= 0 + 13 + 22 + 27$$

$$= \overline{A}\overline{B}\overline{C}\overline{D}\overline{E} + A\overline{B}CD\overline{E} + \overline{A}BC\overline{D}E + AB\overline{C}DE \quad (5)$$

In FIG. 7

$$O_2 = (\overline{0'} + \overline{0})(3' + \overline{1})(5' + \overline{2})(6' + \overline{3})$$

$$= 0 \cdot 0' + 1 \cdot 3' + 2 \cdot 5' + 3 \cdot 6'$$

$$= \overline{A}\overline{B}\overline{C}\overline{D}\overline{E} + A\overline{B}CD\overline{E} + \overline{A}BC\overline{D}E + AB\overline{C}DE \quad (6)$$

It will be clear that equation (6) is identical to equation (5).

Output $O_3$ can be expressed similarly. Thus in FIG. 6

$$O_3 = \overline{\overline{1} \cdot \overline{2} \cdot \overline{3} \cdot \overline{4} \cdot \overline{5} \cdot \overline{6} \cdot \overline{7} \cdot \overline{13} \cdot \overline{14} \cdot \overline{15} \cdot \overline{16} \cdot \overline{17} \cdot \overline{18} \cdot \overline{19} \cdot \overline{20} \cdot \overline{21} \cdot \overline{23} \cdot \overline{24} \cdot \overline{25} \cdot \overline{2} \cdot \overline{7} \cdot \overline{28} \cdot \overline{29} \cdot \overline{30} \cdot \overline{31}}$$

$$= 1+2+3+4+5+6+7+13+14+15+16+17+18$$
$$+19+20+21+23+24+25+27+28+29+30+\lambda$$
$$31$$

Hence $$O_3 = \overline{A}\overline{B}\overline{C}\overline{D}E + \overline{A}\overline{B}\overline{C}D\overline{E} + \overline{A}\overline{B}\overline{C}DE + \overline{A}\overline{B}C\overline{D}\overline{E} +$$
$$\overline{A}\overline{B}C\overline{D}E + \overline{A}\overline{B}C\overline{D}\overline{E} + \overline{A}\overline{B}CDE + A\overline{B}C\overline{D}\overline{E} +$$
$$\overline{A}BCD\overline{E} + A\overline{B}CDE + \overline{A}B\overline{C}\overline{D}\overline{E} + \overline{A}B\overline{C}\overline{D}E +$$
$$\overline{A}B\overline{C}D\overline{E} + A\overline{B}\overline{C}\overline{D}E + \overline{A}B\overline{C}DE + \overline{A}BC\overline{D}\overline{E} +$$
$$AB\overline{C}\overline{D}E + \overline{A}BC\overline{D}E + A\overline{B}C\overline{D}E + AB\overline{C}DE +$$
$$\overline{A}BCDE + ABC\overline{D}\overline{E} + \overline{A}BCDE + ABCDE \quad (7)$$

In FIG. 7

$$O_3 = (\overline{1 \cdot 4' \cdot 5' \cdot 6' \cdot 7' + 0}) \, (\overline{0' \cdot 1' \cdot 3' \cdot 4' \cdot 5' \cdot 6' \cdot 7' + 1}) \times$$
$$(\overline{0' \cdot 1' \cdot 3' \cdot 4' \cdot 7' + 2}) \, (\overline{0' \cdot 1' \cdot 3' \cdot 4' \cdot 5' \cdot 6' \cdot 7' + 3})$$

$$= (1' + 4' + 5' + 6' + 7') \cdot 0 + (0' + 1' + 3' + 4' + 5' + 6' + 7') \cdot 1 +$$
$$(0' + 1' + 3' + 4' + 7') \cdot 2 + (0' + 1' + 3' + 4' + 5' + 6' + 7') \cdot 3$$

Hence $$O_3 = \overline{ABCDE} + \overline{ABC}D\overline{E} + \overline{AB}CD\overline{E} + \overline{A}BCD\overline{E} + $$
$$\overline{A}BCDE + A\overline{BCDE} + A\overline{BC}D\overline{E} + A\overline{B}CD\overline{E} + $$
$$A\overline{B}CDE + AB\overline{CDE} + AB\overline{CD}E + AB\overline{C}D\overline{E} + $$
$$\overline{A}B\overline{CDE} + \overline{A}B\overline{CD}E + \overline{A}B\overline{C}D\overline{E} + \overline{A}B\overline{C}DE + $$
$$\overline{A}BCDE + AB\overline{CDE} + AB\overline{CD}E + ABC\overline{D}\overline{E} + $$
$$AB\overline{C}DE + ABC\overline{D}E + AB\overline{C}DE + ABCDE \quad (8)$$

Again equation (8) is identical to equation (7). In the above equations,

| | |
|---|---|
| $\overline{0'} = \overline{\overline{C} \cdot \overline{D} \cdot \overline{E}}$ | $0' = \overline{C} \cdot \overline{D} \cdot \overline{E}$ |
| $\overline{1'} = \overline{C \cdot \overline{D} \cdot E}$ | $1' = C \cdot \overline{D} \cdot \overline{E}$ |
| $\overline{2'} = \overline{\overline{C} \cdot D \cdot \overline{E}}$ | $2' = \overline{C} \cdot D \cdot \overline{E}$ |
| $\overline{3'} = \overline{C \cdot D \cdot \overline{E}}$ | $3' = C \cdot D \cdot \overline{E}$ |
| $\overline{4'} = \overline{\overline{C} \cdot \overline{D} \cdot E}$ | $4' = \overline{C} \cdot \overline{D} \cdot E$ |
| $\overline{5'} = \overline{C \cdot \overline{D} \cdot E}$ | $5' = C \cdot \overline{D} \cdot E$ |
| $\overline{6'} = \overline{\overline{C} \cdot D \cdot E}$ | $6' = \overline{C} \cdot D \cdot E$ |
| $\overline{7'} = \overline{C \cdot D \cdot E}$ | $7' = C \cdot D \cdot E$ |

Thus it will be clear that a ROM having $2^5$ inputs (32 steps) may be constructed either as shown in FIG. 6 or FIG. 7.

However, in the case of a ROM shown in FIGS. 4 and 5, there are $24 \times 8 = 192$ signals in the direction of X axis and $8 + 64 = 72$ signals in the direction of Y axis. Accordingly, when a pattern is prepared according to the design standard described above, the dimention in the direction of X axis becomes $48 \mu \times (102/2) = 4608 \mu$ and that in the direction of Y axis becomes $28 \mu \times 64 + 12 \mu \times 8 = 1888 \mu$, thus giving an occupation area of the ROM of about 8,7 mm² which is slightly larger than that of the prior example. However, as the lengths in the direction of X and Y axies are decreased whereby this arrangement is suitable for assembling the ROM with integrated circuits. However, in the ROM for use in a computer or the like, such peripheral circuits-control flip-flop circuits are often formed on a single semiconductor chip together with the elements described above. In this example too, since decoders are also formed, the ROM having a dimension of 4.608 mm × 1.888 mm requires an excessively large occupation area thus decreasing the productivity and increasing the manufacturing cost. This is caused by the fact that one grounded lines is commonly used for two output lines of the ROM with the result that the number of the grounded lines increases in proportion to the number of the output lines, thus increasing the percentage of the occupation area of the grounded lines.

SUMMARY OF THE INVENTION

Accordingly it is an object of this invention to provide an improved matrix circuit suitable for constructing a read only memory device, for example, wherein idle output lines adjacent to selected output lines are used as grounded lines (or source lines) so as to greatly decreasing the number of grounded lines required by the prior art design thereby decreasing the area of the semiconductor chip occupied by grounded lines.

Another object of this invention is to provide an improved matrix circuit having square or substantially square configuration and can be readily fabricated with integrated circuits.

According to one aspect of this invention there is provided a matrix circuit comprising first and second groups of input lines, a third group of input lines arranged between the first and second groups of input lines, a plurality of groups of output lines intersecting the input lines of the first, second and third groups, each group of the output lines having one terminal commonly connected to one end of a power source and having the other terminal commonly connected to the ground, a plurality of first switching elements respectively connected to the output lines and selectively driven by an input signal supplied to the first group of input lines, a plurality of second switching elements driven by the same input signal as that supplied to the first switching elements and respectively connected to the output lines each lying adjacent to the output lines connected with the first switching elements, and a plurality of third switching elements respectively connected between adjacent output lines and selectively driven by an input signal supplied to the third group of input lines.

According to another feature of this invention, there is provided a decoder comprising a plurality of column lines respectively connected to load elements connected to a source, a plurality of row lines respectively intersecting the column lines to form a matrix, means to impress two types of logical operation signals "1", "0" upon alternate row lines in accordance with the order of binary codes, a first group of a plurality of semiconductor switching elements each connected across cross-points of the matrix at which alternate row lines receiving two types of the logical operation signals "1", "0" of the code of the least significant order intersect the column lines for forming one type of a logical operation circuit, a second group of a plurality of semiconductor switching elements of the number smaller than the higher orders of the binary codes by one and connected across the cross-points of the matrix at which alternate row lines receiving two types of the logical operation signals "1", "0" of the higher orders of binary codes intersect the column lines to form the other type of the logical operation circuit, the cross-points between the semiconductor switching elements of the second group being not connected to semiconductor elements, thereby selecting one column line as the output.

This invention can be more fully understood from the following detailed description when taken in conjunction with the accompanying drawings, in which:

DETAILED DESCRIPTION OF THE INVENTION

The preferred embodiments of this invention will now be described with reference to the accompanying drawings. As a first embodiment a read only memory device (ROM) constructed by using the matrix circuit of this invention will firstly be described. In constructing a ROM having $x$ inputs, that is $2^x = m$ steps, the inputs $2^x$ is divided into $2^{x-y}$ and $2^y$, where $x$, $y$ and $m$ are integers, and $x$ and $y$ have a relation $x-y \leq y$. The outputs are produced by $2^{x-7}$ wired OR gate circuits which are arranged in $2^y$ matrix circuits. The one gate circuits of the ROM is divided into two groups through $2^{x-y}$ switching elements. One group is connected to output lines and the other group is connected to one side of a source through load elements. The other gate circuits of the ROM are connected to the other or grounded side of the source. The matrix circuit is constructed such that, for the $n$th gate, with signal of $2^{x-y}$ output signals is applied to the switching element on said one side of the source as the input signals whereas $(n+1)$th or $(n-1)$th output signal is applied to the input of the switching element on the other or grounded side of the source. In this manner, the enabled gate is shifted successively as if the other grounded line of the source is actually provided.

Figure 9A:
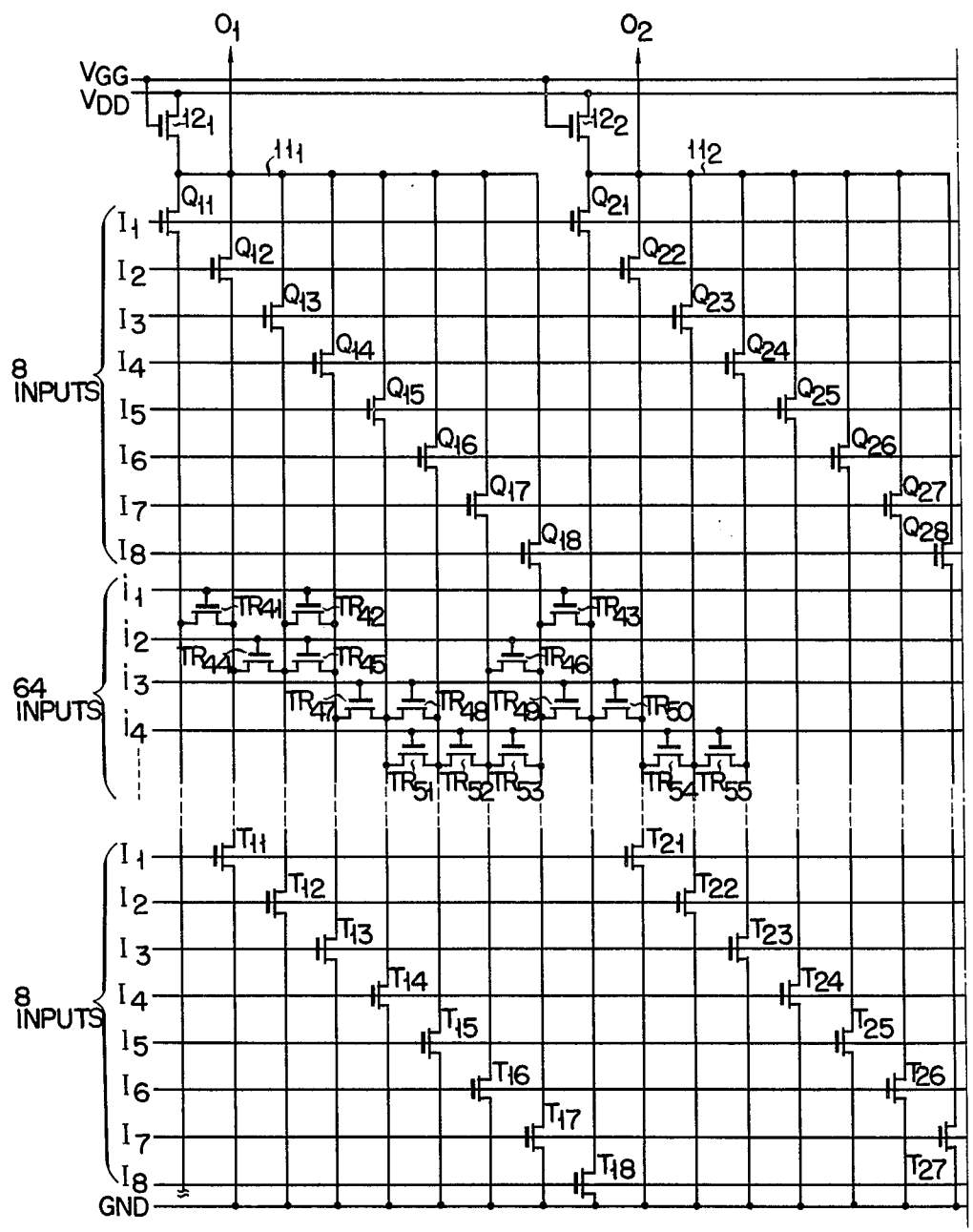
FIGS. 9A and 9B show a connection diagram showing one embodiment of this invention.
Figure 9B:
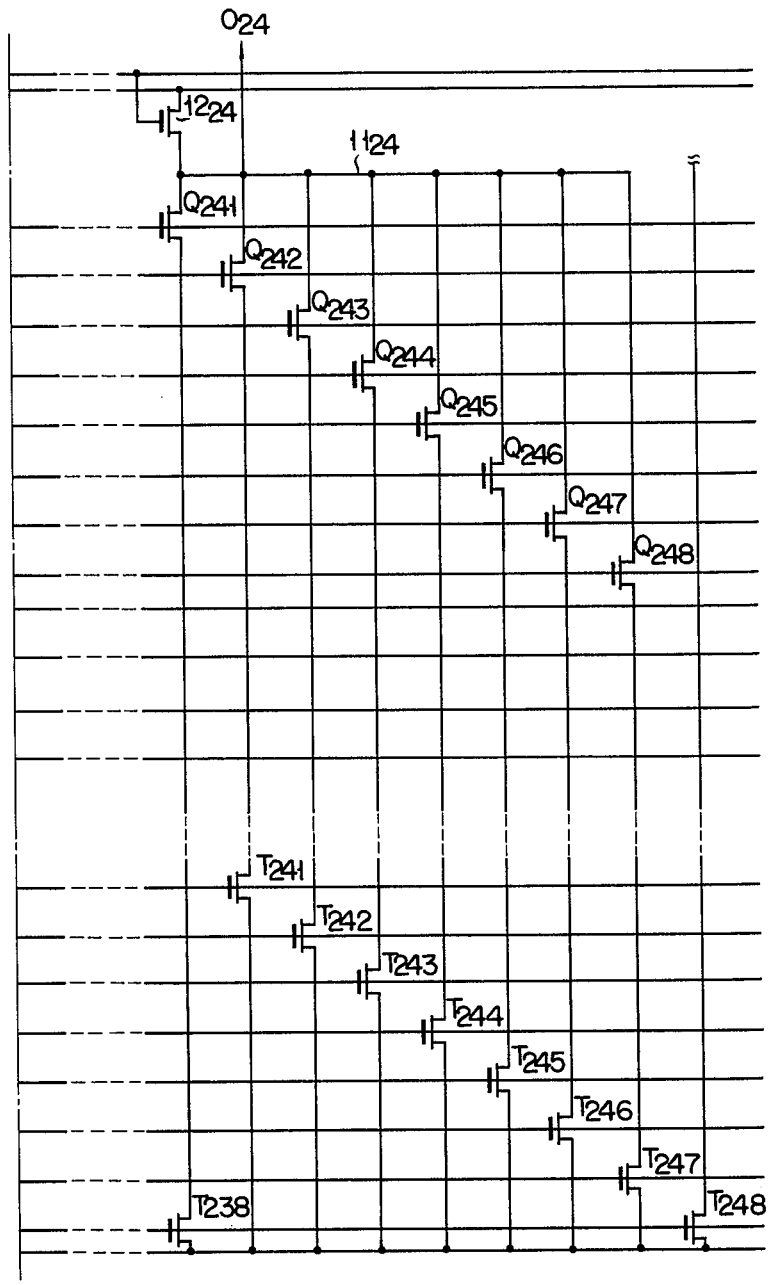

FIG. 9 shows a 512 step ROM constituted by P channel field effect transistors, for example. More particularly, transistors $Q_{11}$ to $Q_{18}$, $Q_{21}$ to $Q_{28}$, ... $Q_{241}$ to $Q_{248}$ comprise one group of the total number $2^{x-y}$, and transistors $T_{11}$ to $T_{18}$, $T_{21}$ to $T_{27}$ ... $T_{241}$ $T_{248}$ respectively shifted one step from transistors $Q_{11}$ ... $Q_{248}$ comprise another group of the total number of $2^{x-y}$. Transistors $TR_{41}$, $TR_{42}$ ... $TR_{55}$ selectively connected between adjacent output conductors or lines are driven by input lines corresponding to 64 inputs $i_1$ to $i_{64}$ for interconnecting adjacent output lines, respectively. $2^{x-y}$ input lines $I_1$ to $I_8$ and corresponding output lines are interconnected by respective transistors for forming wired OR gate circuits $11_1$ to $11_{24}$ which are connected across a source $V_{DD}$ via load MOS transistors $12_1$ to $12_{24}$ respectively for producing outputs $O_1$ to $O_{24}$. A source $V_{GG}$ is provided for biasing the gate electrodes of the load MOS transistors $12_1$ to $12_{24}$. The opposite ends of the output lines are connected to a common grounded line GND.

Figure 5A:
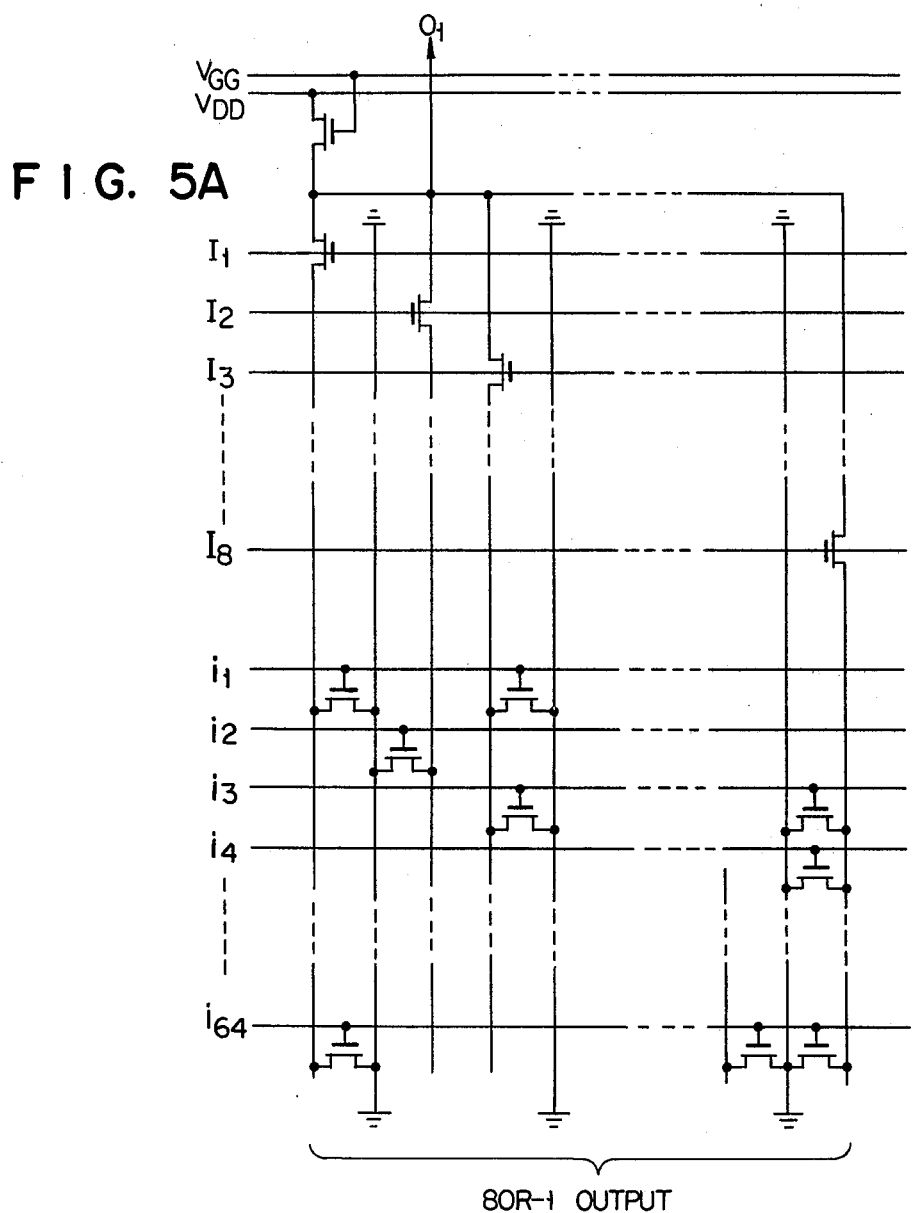
FIG. 5a is connection diagram showing the electrical connection of the ROM shown in FIG. 4.
Figure 5B:
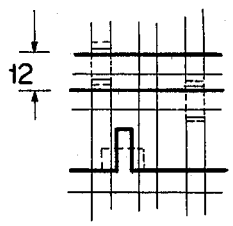
FIG. 5b shows a portion of the pattern arrangement of the ROM shown in FIG. 4.
Figure 6:
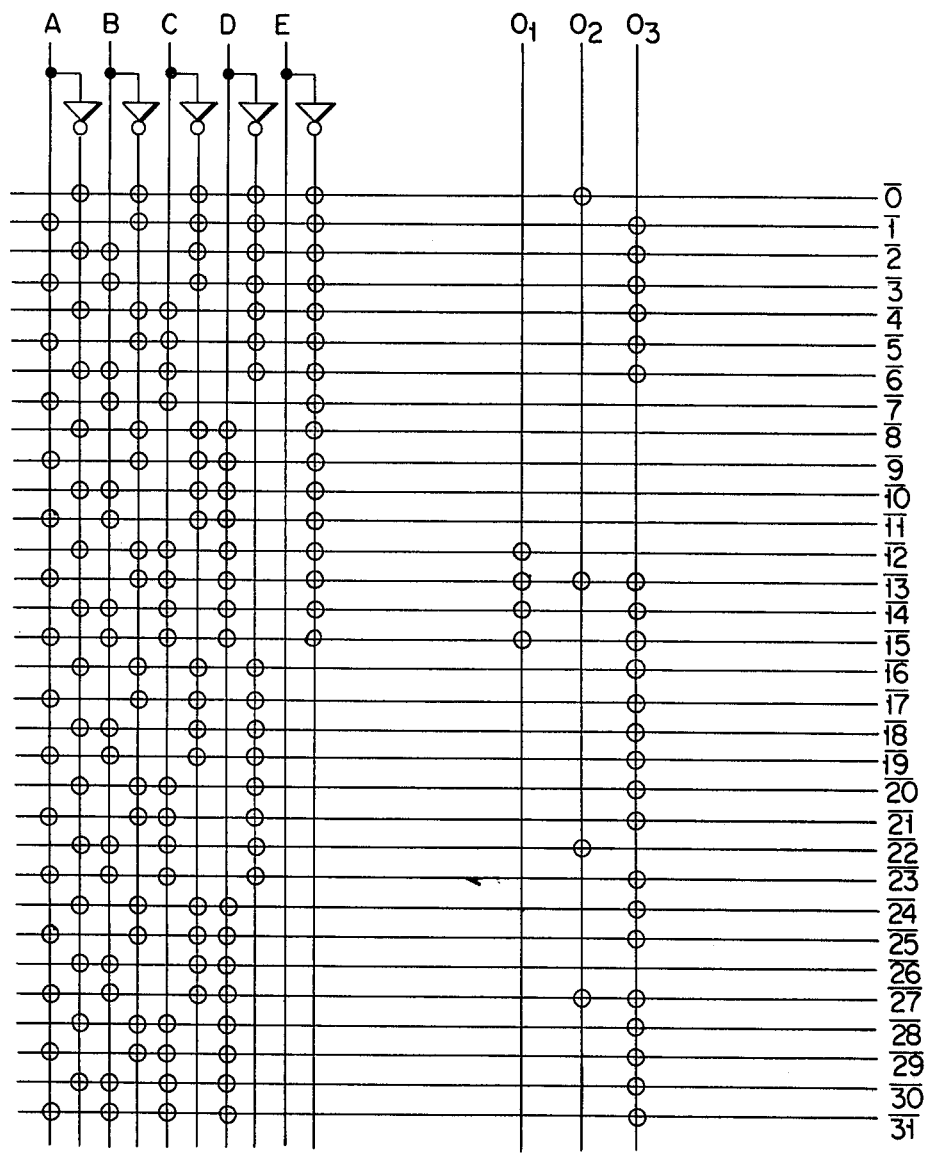
FIG. 6 shows a diagrammatic wiring of a 32 step ROM corresponding to that shown in FIG. 1.
Figure 7:
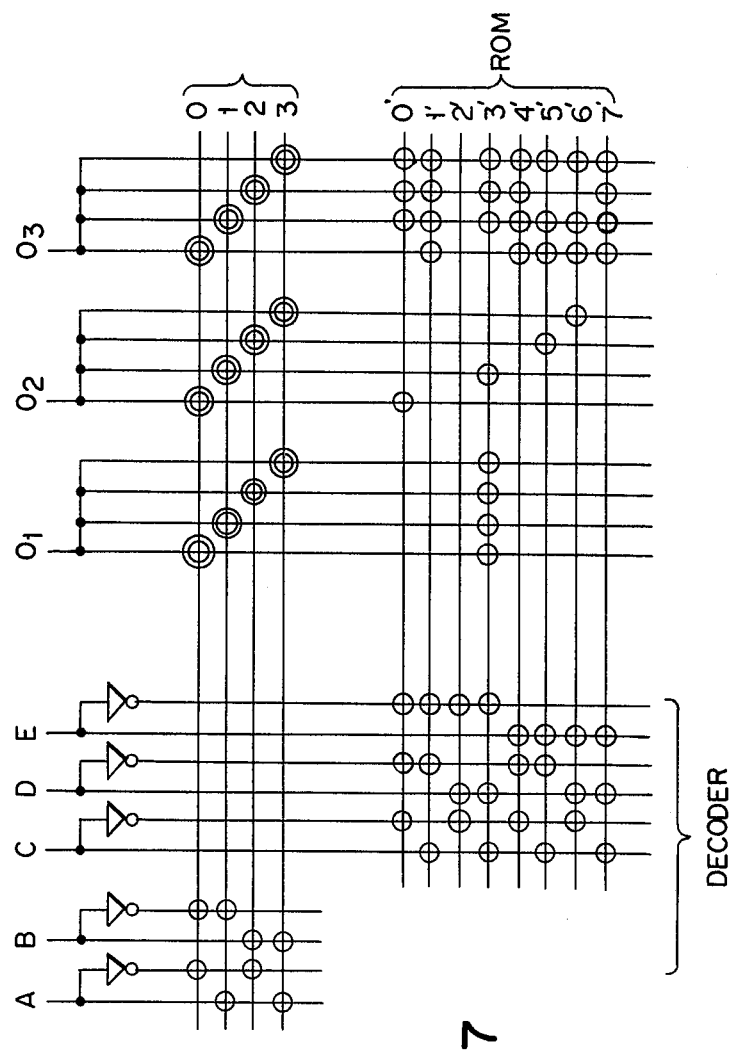
FIG. 7 shows a diagrammatic wiring of a 32 step ROM corresponding to that shown in FIG. 4.
Figure 8:
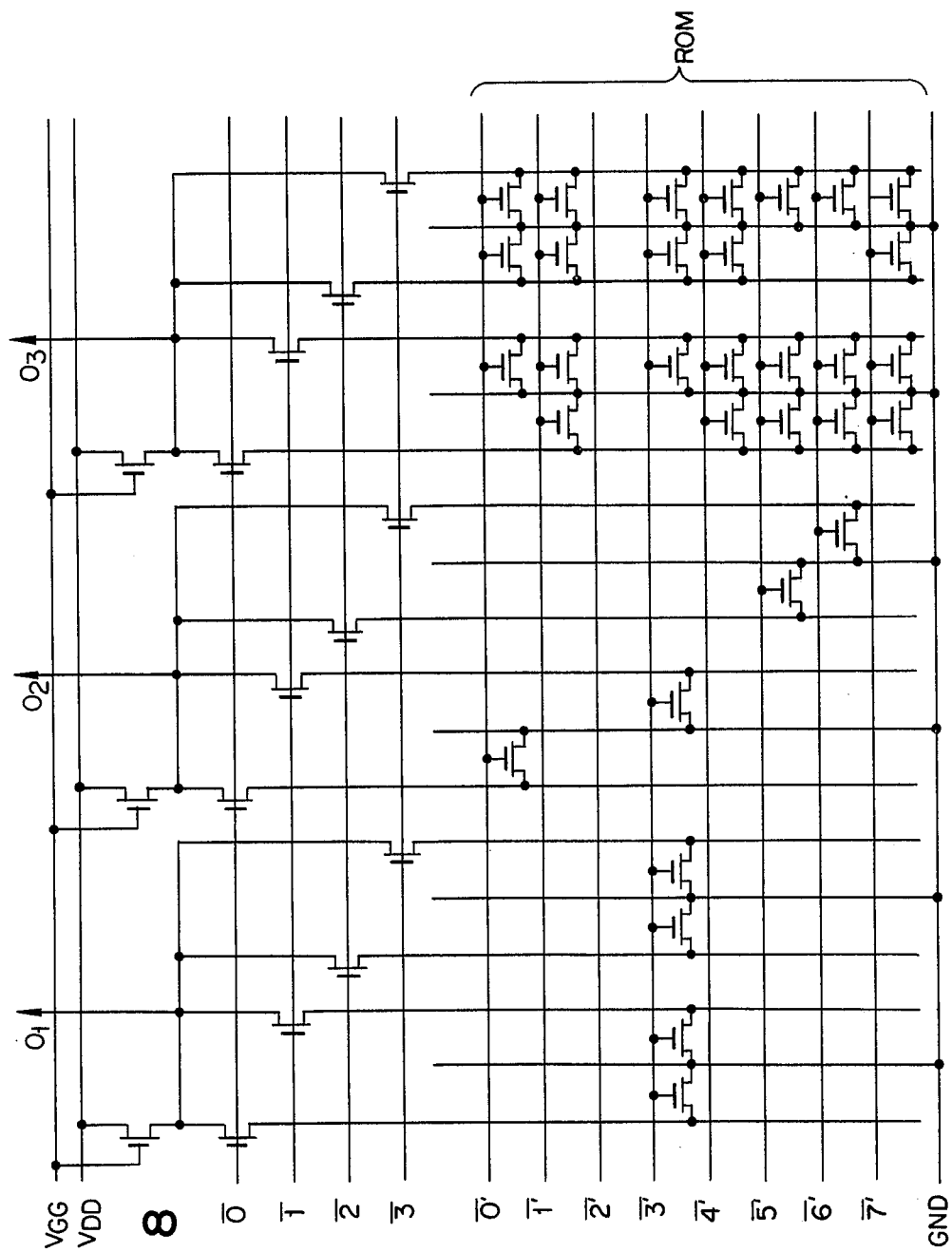
FIG. 8 is a connection diagram showing the detail of the ROM shown in FIG. 7.

The ROM shown in FIG. 9 is different from the conventional ROM shown in FIG. 5 in that the grounded lines (the gate circuits for input $i_1$, $i_2$ ... $i_{64}$) for the wired OR gate circuits shown in FIG. 5 are not provided. In the ROM shown in FIG. 9, when a gate circuit of the transistor $Q_{11}$ is operated this transistor must be ON.

Figure 1:
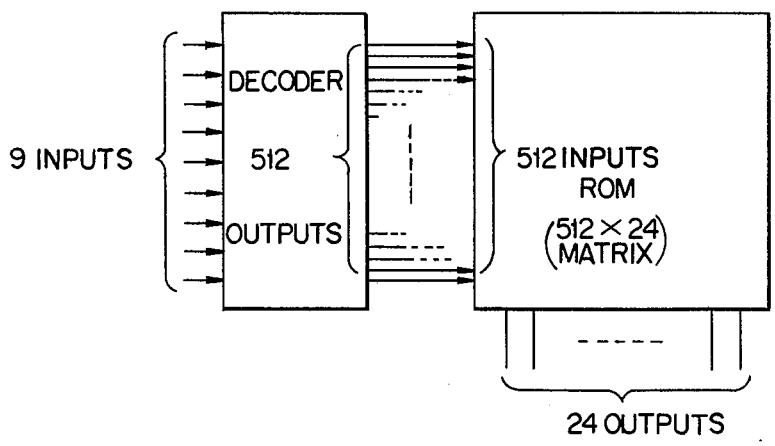
FIG. 1 is a block diagram showing a prior art 512step ROM.
Figure 2:
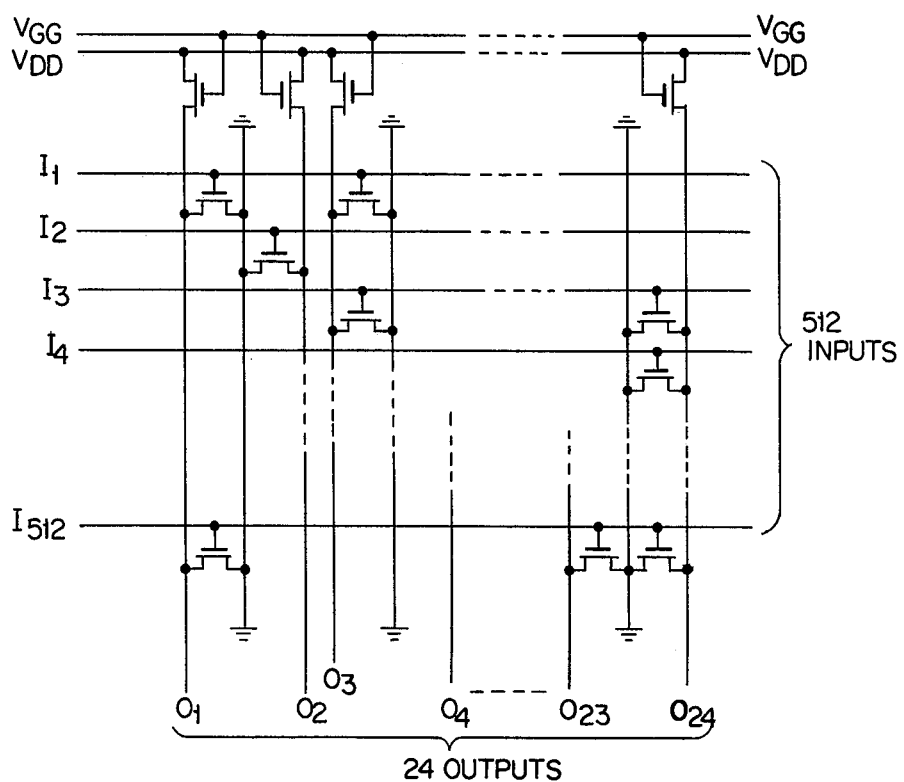
FIG. 2 is a connection diagram showing the electrical connection of the ROM shown in FIG. 1.
Figure 3:
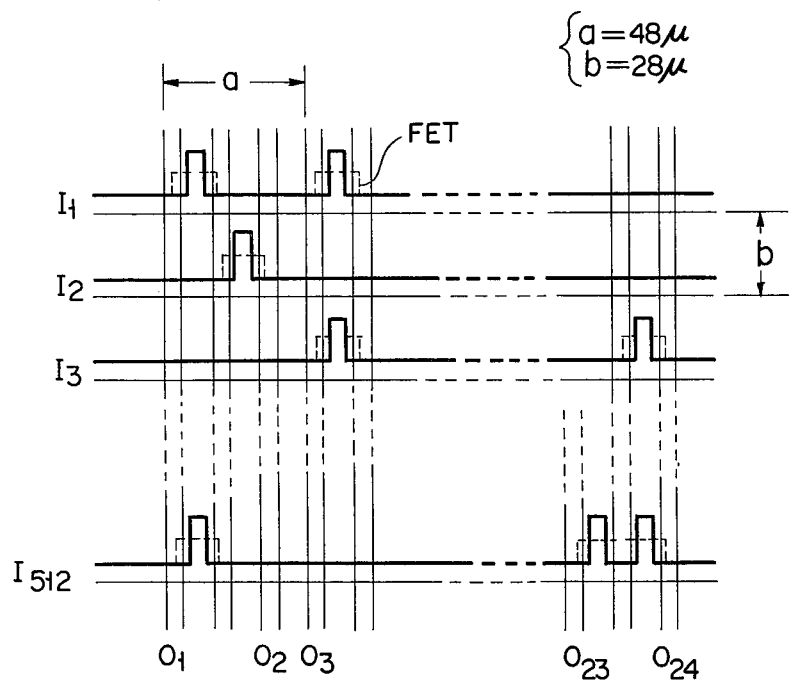
FIG. 3 is a diagrammatic representation of the pattern arrangement of the ROM.
Figure 4:
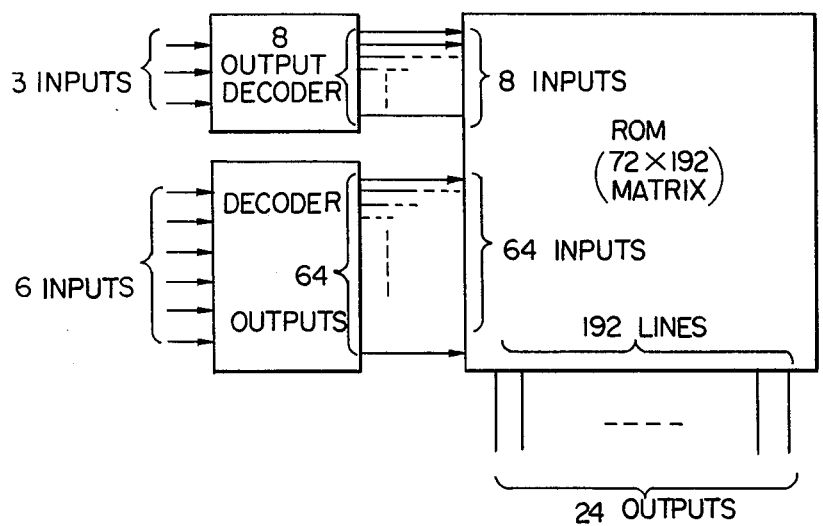
FIG. 4 is a block diagram showing another example of the prior art 215 step ROM.

At this time, since input $I_1$ has a negative voltage, transistor $I_{11}$ is ON so that when transistor $TR_{41}$, for example of 64 step logical gate circuit is rendered ON, a gate circuit including transistors $Q_{11} \rightarrow TR_{41} \rightarrow T_{11}$ is formed to form a ROM. Thus, in the example shown in FIG. 9, a line to the right (or left) of the operated gate circuit is grounded thus enabling a wired OR gate circuit. This arrangement greatly reduce the dimension of the ROM. When a pattern is arranged according to the pattern design standard described above, the dimension per bit of the 512 step MOS from which exclusive grounded lines have been eliminated would be 16 $\mu$ × 28 $\mu$ since the grounded lines have been eliminated. For this reason, its occupation area becomes 16 $\mu$ × 24 (outputs) × 8 (OR circuits) + 16 $\mu$ = 3088 $\mu$ in the direction of X axis, and 28 $\mu$ × 64 (signals) + 12 $\mu$ × 3 (signals + 12 $\mu$ × 8 (signals) = 1984 $\mu$ in the direction of Y axis, or about 6.127 mm² which is about 25.8% smaller than that of the example shown in FIG. 2 and about 29.6% smaller that of the example shown in FIG. 5. Moreover, as the lengths of respective sides are 3.09 mm, and 1.98 mm respectively, which are small and relatively close each other, this construction of the ROM can be readily fabricated with integrated circuits.

Figure 10:
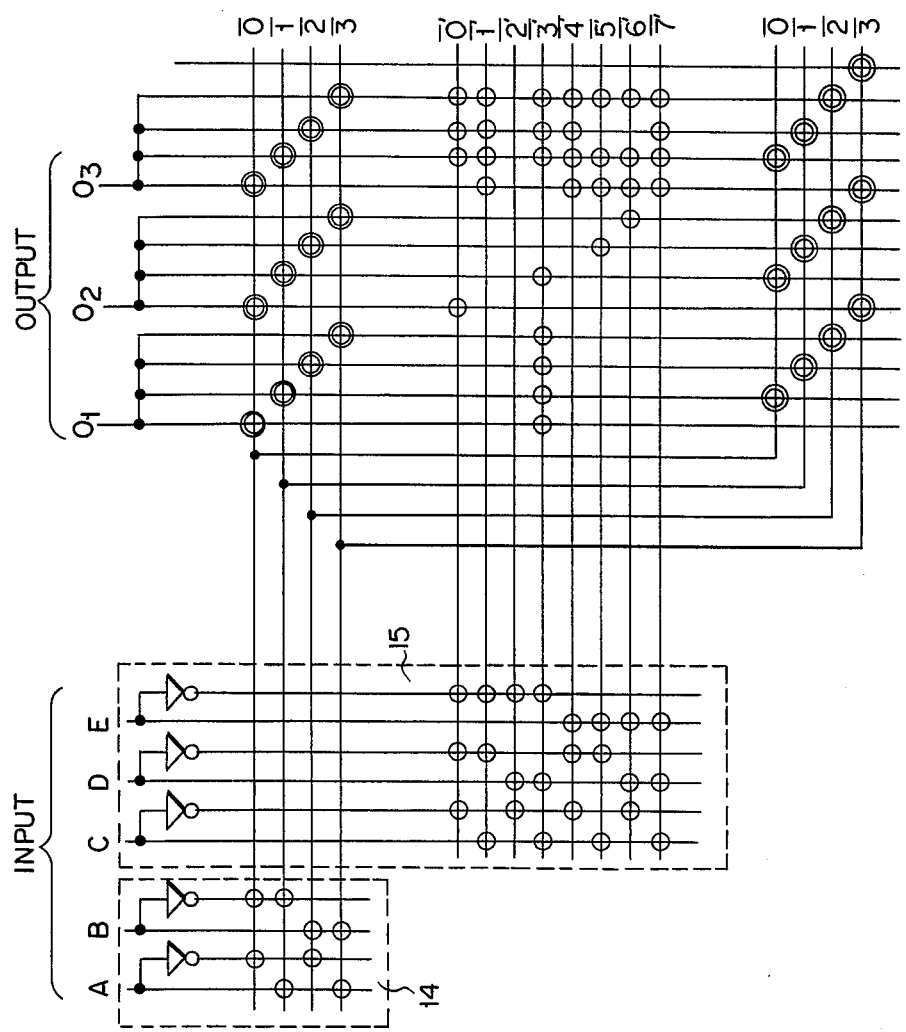
FIG. 10 shows a diagrammatic wiring of a 32 step ROM utilizing the matrix circuit shown in FIG. 9.
Figure 11:
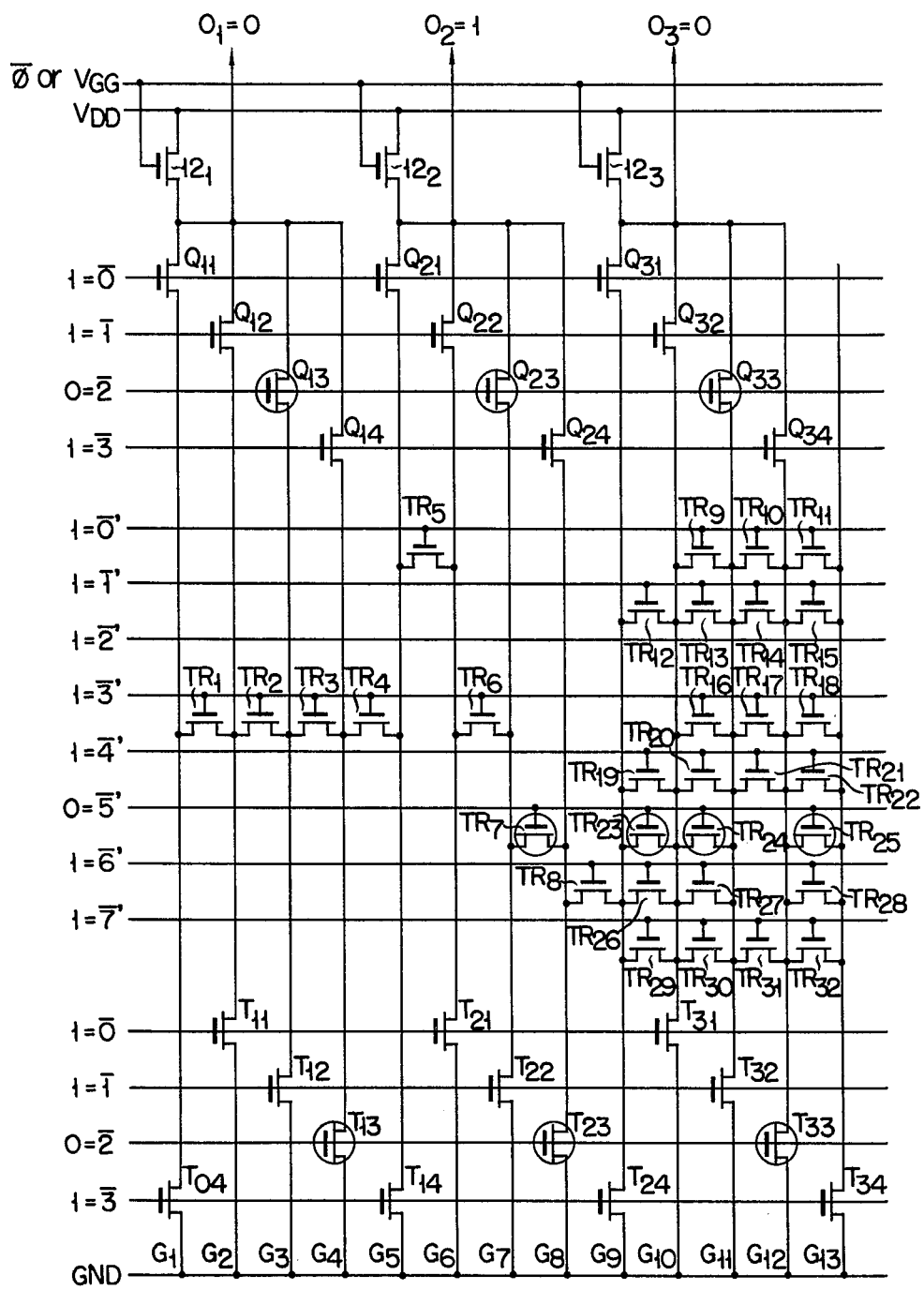
FIGS. 11, 12 and 13 are diagrams useful to explain the operation of the 32 step ROM.

The operation of the ROM described above will be described by taking a 32 step MOS shown in FIGS. 10 and 11 as an example. In FIG. 10, numerals 14 and 15 designate decoders, respectively, single line circle and double line circle respectively represent switching elements, and the codes are selected such that 0' represents 0 address, 1' the fourth address, 2' the eighth address, 3' the 12th address, 4' the 16th address, 5' the 20th address, 6' the 24th address and 7' the 28th address. The switching elements utilized in the circuit shown in FIG. 11 are all P channel field effect transistors. Let us now assume that the address is the 24th address, then the following inputs are applied, $A=0$, $B=1$, $C=1$, $D=0$ and $E=1$. Then, only the output $\bar{2}$ from decoder 14 will be at "0" level ($-E$ volt) and the other outputs will be at "1" level (ground level). Further, only the $\bar{5}'$ output from decoder 15 will be at "0" level and the other outputs at "1" level. As a result, transistors $Q_{11}$, $Q_{12}$, $Q_{14}$, $Q_{21}$, $Q_{22}$, $Q_{24}$, $Q_{31}$, $Q_{32}$ and $Q_{34}$ of the ROM are rendered OFF, whereas transistors $Q_{13}$, $Q_{23}$ and $Q_{33}$ are rendered ON. Further, transistors $T_{11}$, $T_{12}$, $T_{14}$, $T_{21}$, $T_{22}$, $T_{24}$, $T_{31}$, $T_{32}$ and $T_{34}$ are rendered OFF whereas transistors $T_{13}$, $T_{23}$ and $T_{33}$ are rendered On. In FIG. 11 ON transistors are bounded by circles. On the other hand, for $2^3$ inputs or 8 input signals (output signals from the decoder 15). Since only output $\bar{5}'$ is at "0" level, transistors $TR_7$, $TR_{23}$, $TR_{24}$ and $TR_{25}$ are rendered ON and the other transistors OFF. Accordingly, only a gate circuit of $Q_{22} - TR_7 - T_{23}$ is established and its output $O_2$ is at the ground level or "1" level. However, both outputs $O_1$ and $O_3$ are caused to be at the "0" level of the source $V_{DD}$ by the load MOS transistors $12_1$ and $12_3$. This is because outputs $O_1$, $O_2$ and $O_3$ are given by equations (1) through (8) and because only output $O_2$ is at "1" level.

It is particularly noted that when the gate circuits $G_3$, $G_7$ and $G_{11}$ shown in FIG. 11 are established the gate circuits $G_4$, $G_8$ and $G_{12}$ respectively to the right of $G_3$, $G_7$ and $G_{11}$ are brought to the ground level. In this embodiment, for the purpose of realizing such conditions, respectively corresponding to transistors $Q_{11}$ to $Q_{14}$, $Q_{21}$ to $Q_{24}$, $Q_{31}$ to $Q_{34}$ are provided transistors $T_{11}$ to $T_{14}$, $T_{21}$ to $T_{24}$, $T_{31}$ to $T_{34}$ on the side of the ground and these transistors are ON, OFF conrolled by the output signals $\bar{0}$, $\bar{1}$, $\bar{2}$, and $\bar{3}$ from decoder 14. More particularly, the circuit is constructed such that whenever the nth gate circuit $G_n$ is operated, the adjacent gate circuit $G_{n+1}$ or $G_{n-1}$ will be brought to the ground level. In order to provide a combined gate and ground line, an output line selected from the output lines for the output signals $\bar{0}'$ to $\bar{7}'$ from decoder 15 is used to drive a corresponding transistor for connecting only a predetermined output line to the adjacent output line and to the grounded line thereby producing outputs $O_1$ $O_2$ and $O_3$.

Figure 12:
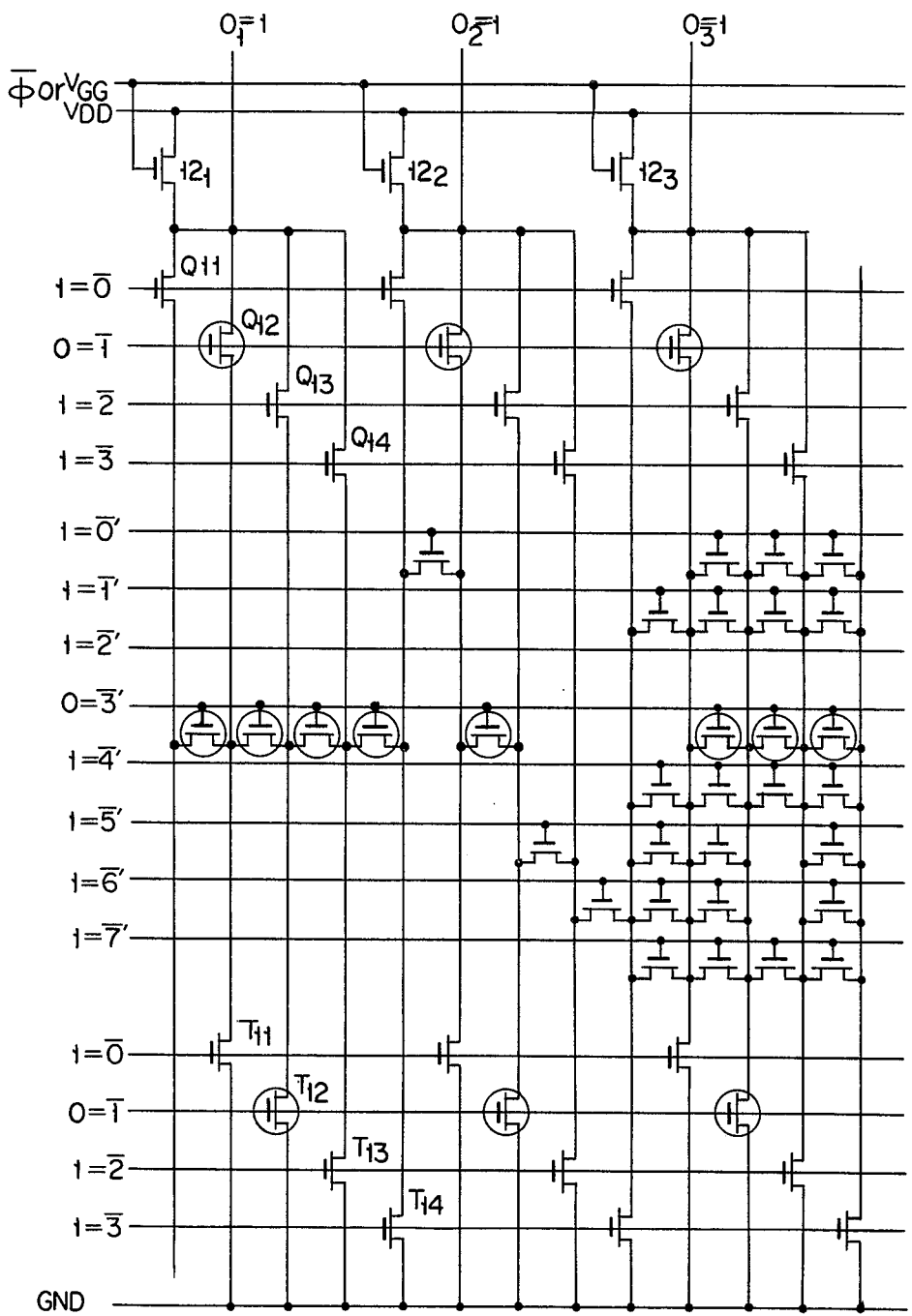
Figure 13:
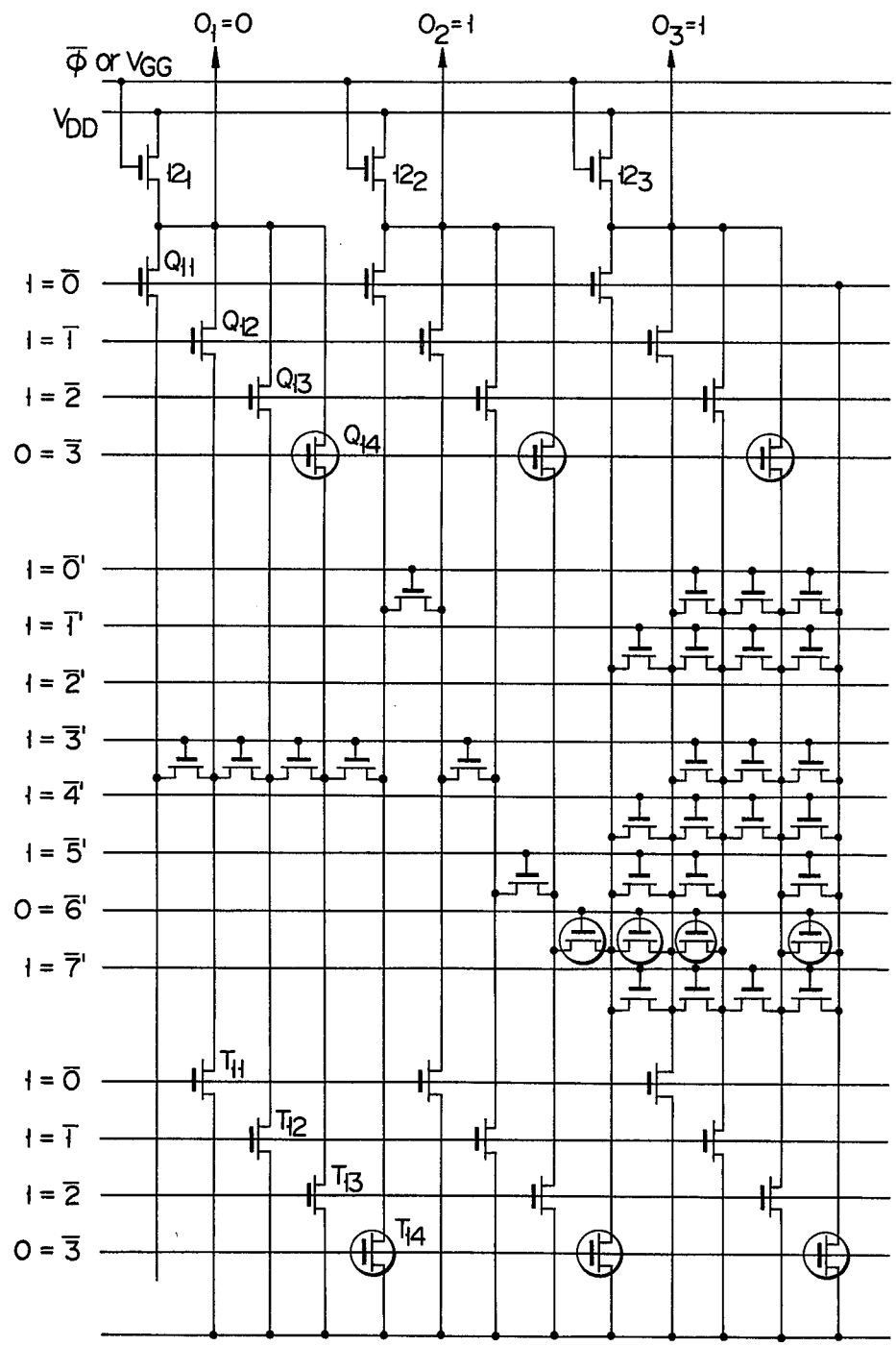

FIG. 12 is a diagram for explaining the operation of a case wherein the address is the 13th address, and inputs A = "1", B = "0", C = "1", D = "1" and E = "0" are supplied for obtaining outputs $O_1$ = "1", $O_2$ = "1" and $O_3$ = "1" whereas FIG. 13 is a diagram for explaining the operation of another case in which the address is the 27th address, and inputs A = "1", B = "1", C = "0", D = "1" and E = "1" are applied for obtaining outputs $O_1$ = "0", $O_2$ = "1" and $O_3$ = "1". When the gate circuit is at "1" level, the addresses are as follows.

$$O_1 = 12 + 14 + 13 + 15$$

$$O_2 = 0 + 13 + 22 + 27$$

$$O_3 = 1+2+3+4+5+6+7+13+14+15+16+17+18+19+ \\ 20+21+23+24+25+27+28+29+30+31$$

With the ROM described above, the larger is the number of the outputs, the larger is the merit. For example, where a 512 step ROM requires 24 output lines, and where the gate circuits are arranged in a pattern by using P+ diffused layers, the prior art ROM requires {8 (OR circuits) + 4 (addresses)} × 24 (outputs) = 288 P+ diffused layers, whereas in this embodiment, the number of the diffused layers can be greatly reduced to 8 (OR circuits) × 24 (outputs) + 1 = 193, thus greatly reducing the size of the chip.

Although, in the foregoing description a positive logic was used wherein −E volt was used as the "0" level and the ground potential as the "1" level, it will be clear that it is also possible to construct a negative logic circuit. Further, only the P channel field effect transistors were explained in terms of ratio circuits it will be clear that it is also possible to use N channel field effect transistors or ratioless circuits, a mixture of P and N channel field effect transistors, or bipolar elements. Further, instead of using a grounded conductor as a source, a synchronous signal such as a clock pulse utilized for precharging can also be used. Similarly, a synchronous signal (a clock pulse or a strobe signal) can be used instead of sources $V_{DD}$ and $V_{GG}$.

Figure 14:
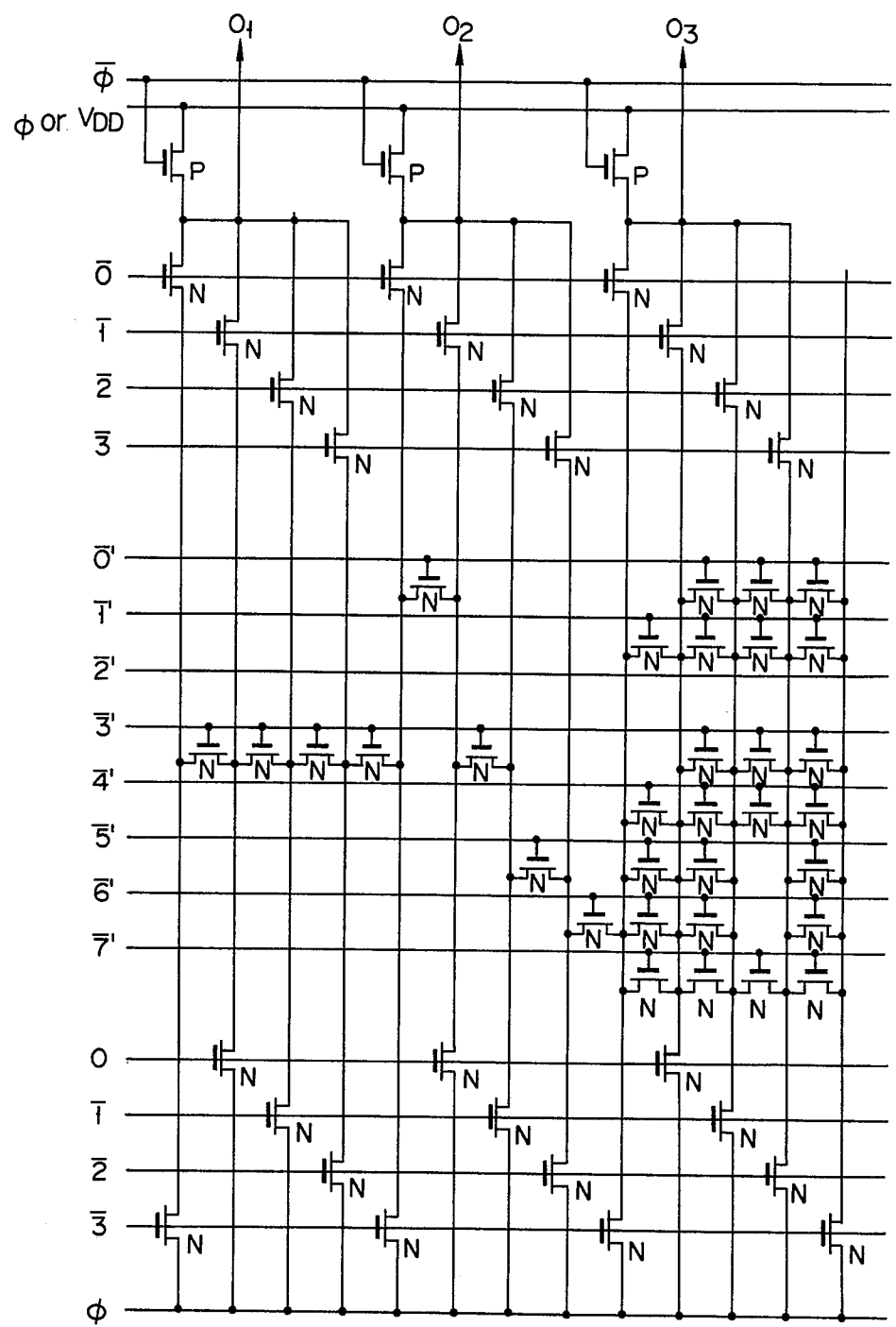
FIGS. 14 through 18 are diagrams showing a modification of the 32 step ROM.
Figure 15:
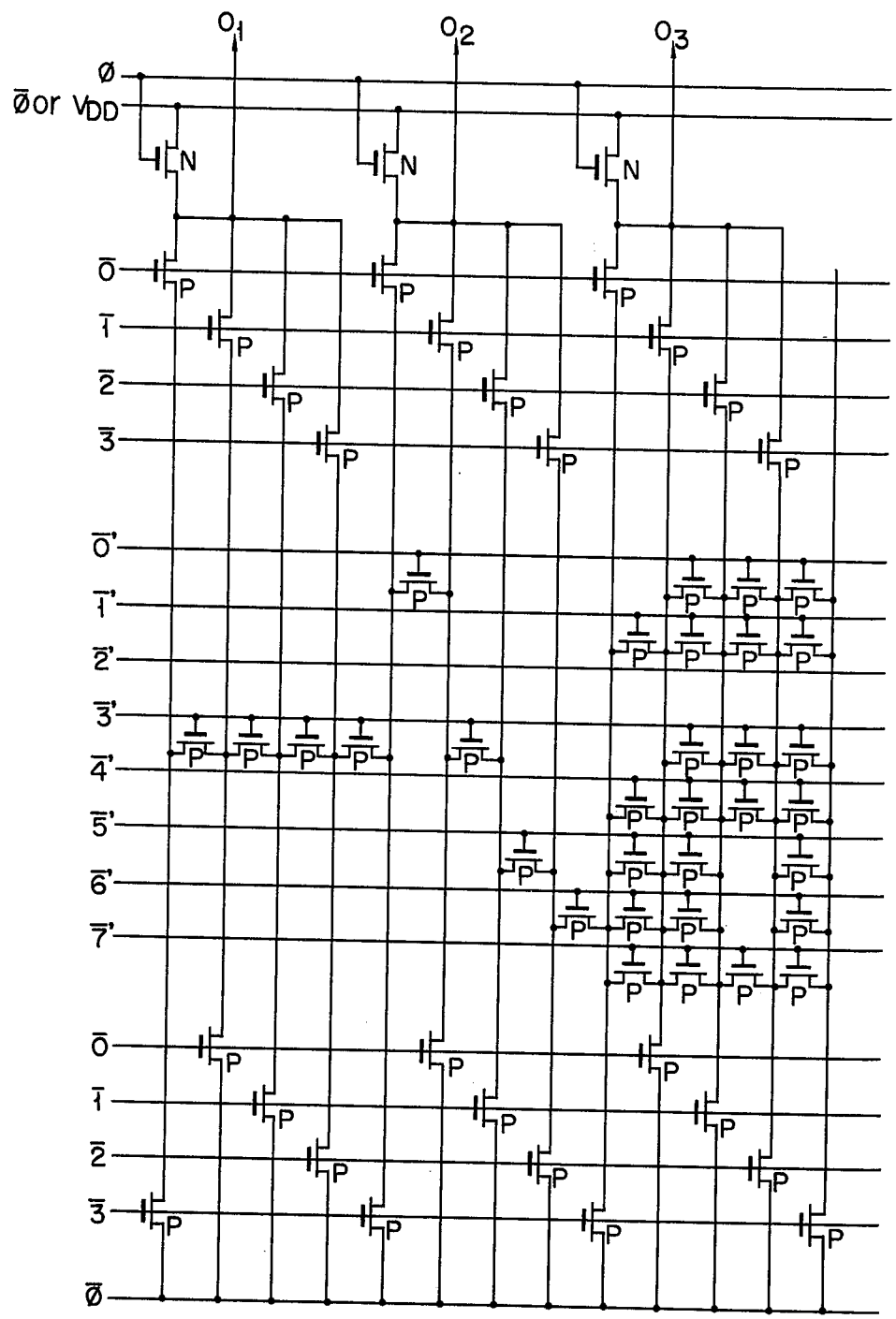
Figure 16:
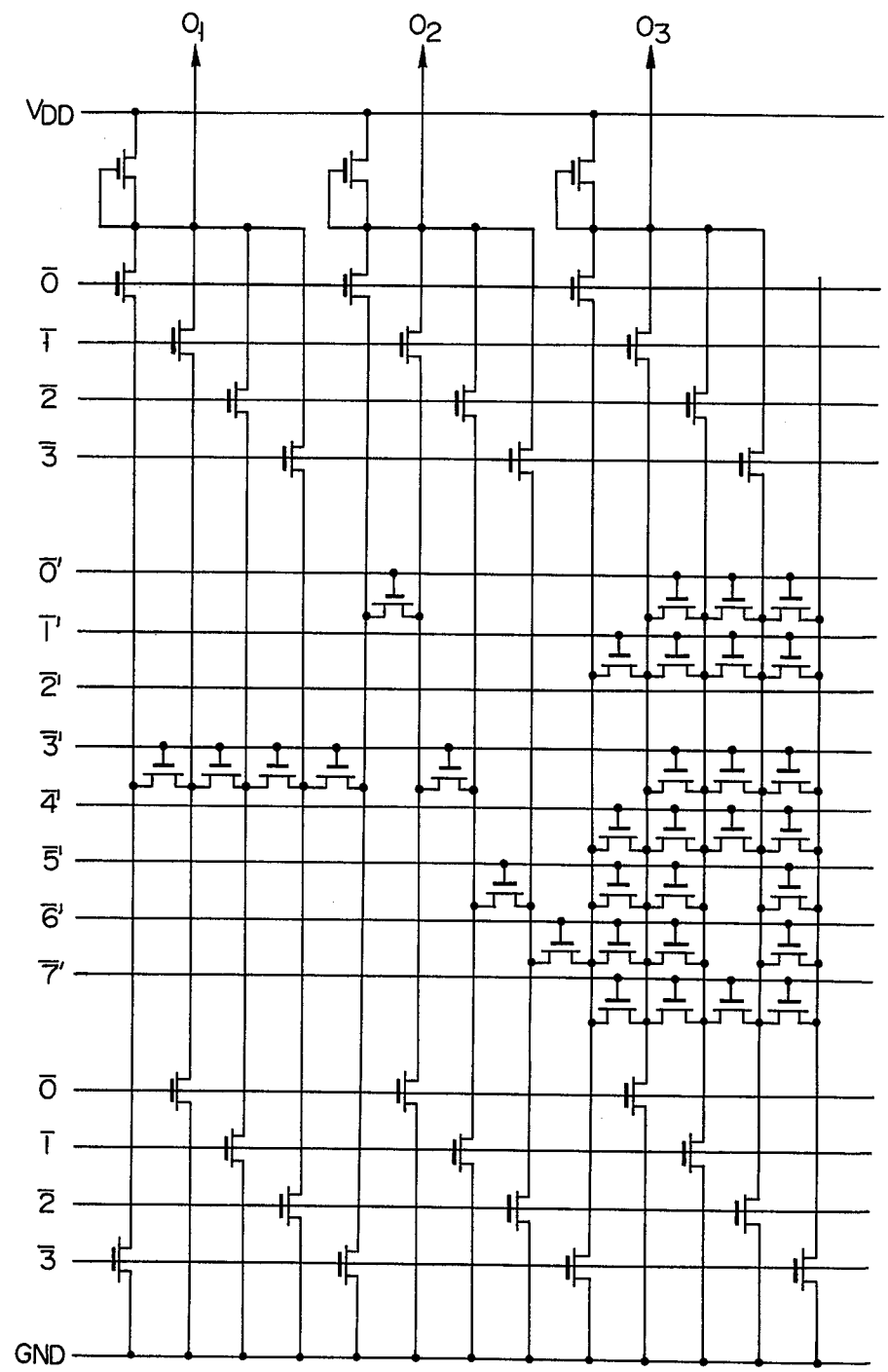
Figure 17:
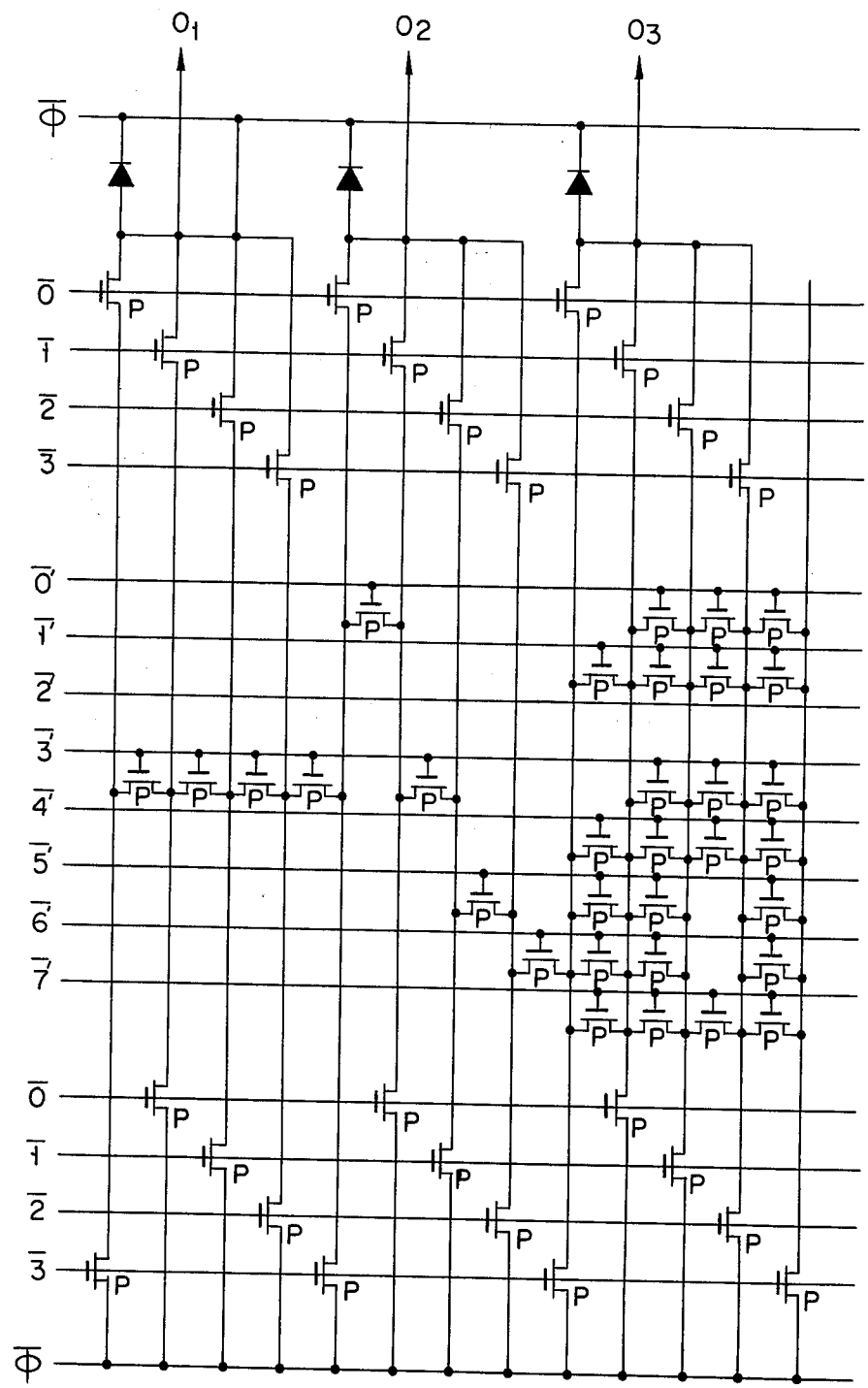
Figure 18:
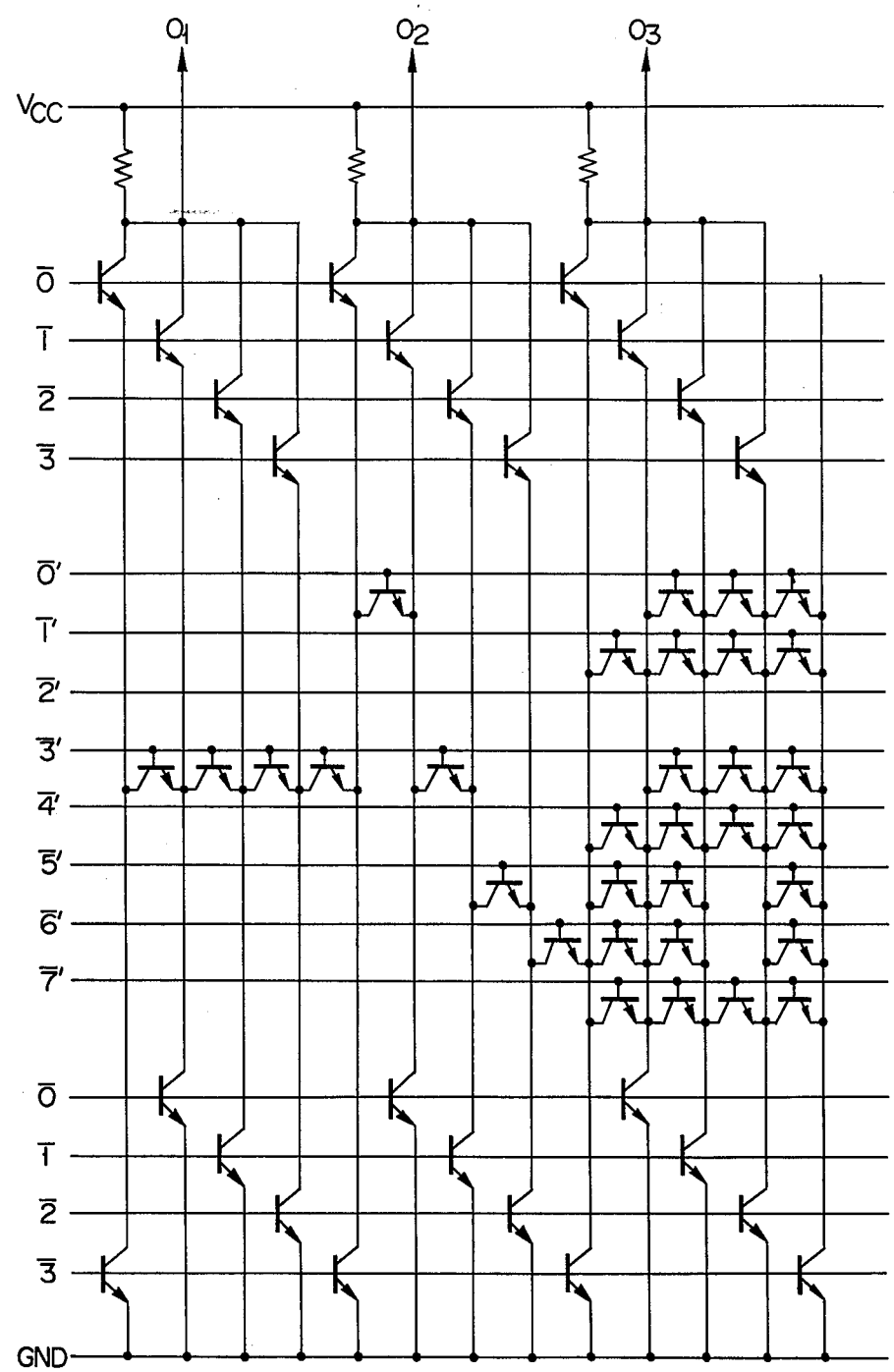

FIG. 14 shows a modified 32 step ROM wherein conjugats MOS transistors are used, that is the load MOS's are constituted by P channel field effect transistors while the other switching elements are comprised by N channel field effect transistors, and clock pulses $\phi$ and $\bar{\phi}$ are used as the sources. The use of clock pulses as the sources reduces power consumption. FIG. 15 shows another example of a ROM utilizing conjugate type MOS transistors in which conductivity types P and N are reversed from those shown in FIG. 14. FIG. 16 shows a modification utilizing E/D MOS transistors, that is enhancement-depletion MOS transistors. In FIG. 17, diodes are used as the load elements and in FIG. 18 resistors are used as the load elements, while bipolar transistors are used as the switching elements. In these modifications, elements corresponding to those of the first embodiment are designated by the same reference characters for the sake of ready understanding.

In the foregoing embodiments, although ROMs using usual number of steps were shown, decoders for driving the RCM (for example decoders 14 and 15), display decoders, and logical circuits including randam gate circuits are arranged in meshes (matrixes) can also be used in this invention.

Figure 19:
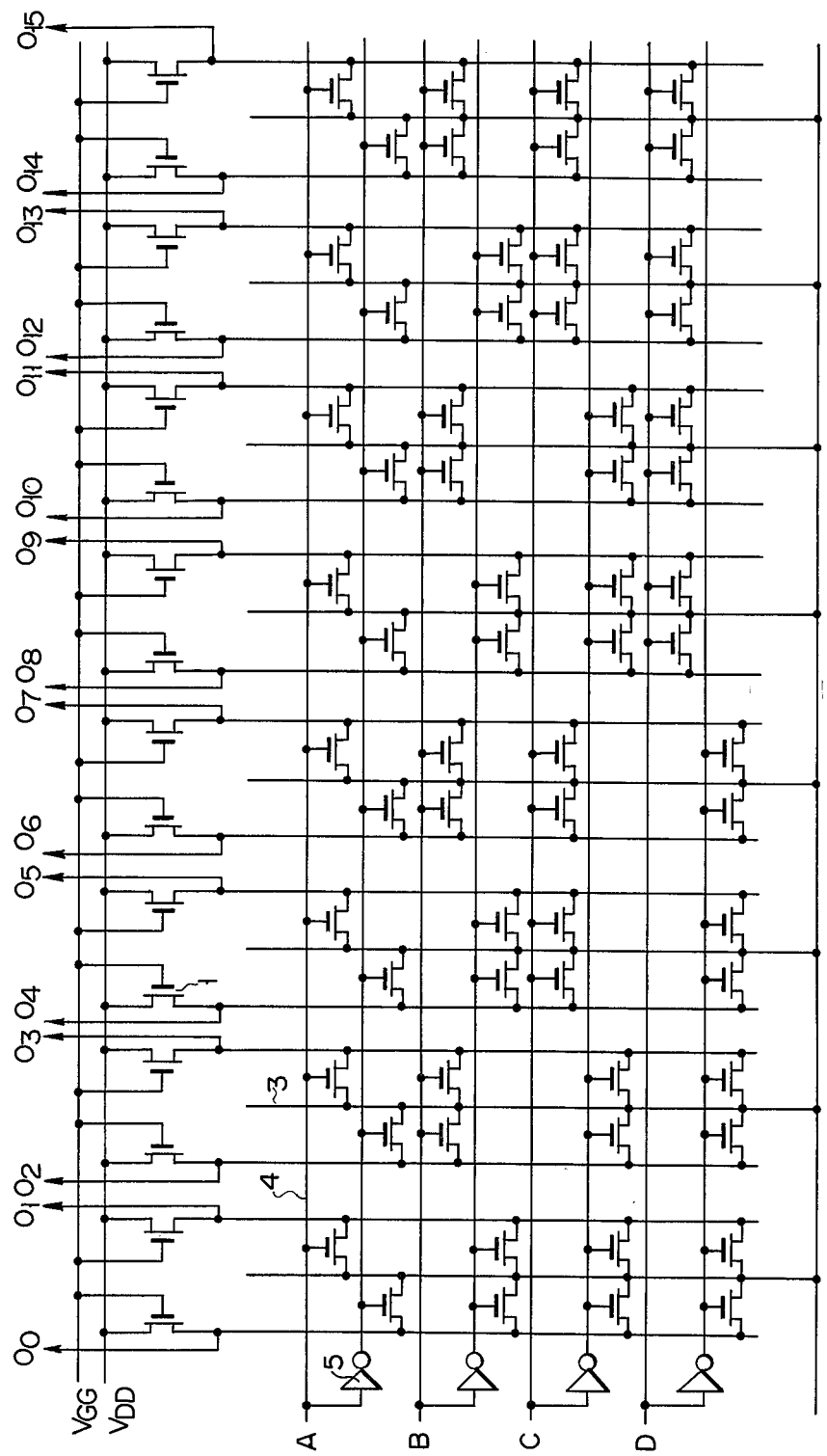
FIG. 19 is a connection diagram of a prior art decoder.
Figure 20:
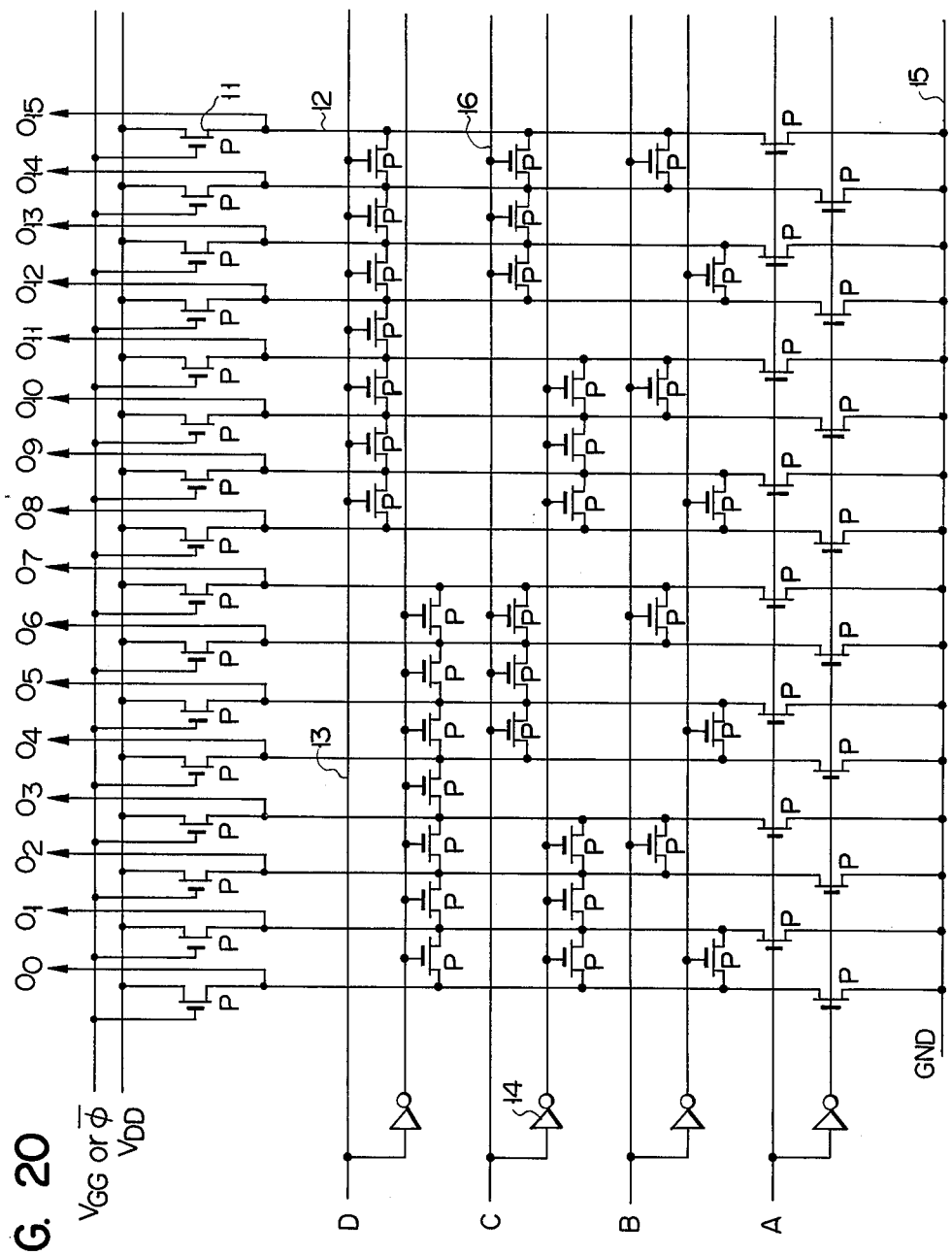
FIG. 20 is a connection diagram showing a modified decoder utilized in this invention.

FIGS. 19 through 27 show examples of the decoders of the matrix circuits. In these examples, 4 input decoders up to 16th addresses are illustrated. FIG. 19 shows a prior art decoder and FIG. 20 shows a ratio type P channel MOS decoder of this invention.

The decoder of this embodiment is characterized in that the semiconductor switching elements are arranged at the cross-points between the row and column lines of the matrix such that the semiconductor switching elements of the number smaller than the number of the binary codes are disposed at alternate cross-points respectively corresponding to "0" and "1" levels or logical operation signals and that no semiconductor element is connected between the alternate semiconductor switching elements.

The embodiment shown in FIG. 20 is different from that shown in FIG. 19 in that it is not provided with transistors corresponding to transistors $Q_{11}$ to $Q_{18}$, $Q_{22}$ to $Q_{28}$ and $Q_{241}$ to $Q_{248}$ shown in FIG. 19 and that output lines other than those to be selected are connected to grounding line GND.

In the conventional decoder, it is usual to use a single grounded line in common for two output lines. FIG. 19 shows a prior art decoder circuit of the type wherein one output line is selected among a plurality of output lines. In this decoder, load elements 1 are connected to source $V_{DD}$ and input signals in the form of binary codes are supplied to row lines 4 intersecting column lines 2 connected with the load elements, to form the matrix circuit. Each pair of column lines 2 acting as the output lines of the decoder is commonly connected to one grounded line 3. The logical operation signals in the form of binary codes are designated by symbols A, B, C, and D respectively corresponding to 1, 2, 4 and 8 of the binary codes. Furthermore, a semiconductor elements are connected between two column lines 2 and the grounded line 3 to complete a logical operation circuit. Input signals in the form of "1" and "0" are applied to the inputs of which "0" signals are applied to alternate row lines 4. Assume now that logical operation signals A, B, C and D respectively in the form of "0", "1", "0" and "0" are applied to the input and that the logic holds at "1" level, upon application of the voltage of source $V_{DD}$, output line $O_2$ would be selected. To perform such logical operation, the semiconductor elements are arranged in the following manner. More particularly, semiconductor elements of the number corresponding to that of the binary codes are disposed at the crosspoints of the matrix corresponding to the "1" and "0" levles of the input signals A, B, C, and D. Thus, for signal A, one semiconductor element is connected to alternate row lines corresponding to "1" and "0" levels, respectively. For signal B adjacent two semiconductor elements are connected to alternate row lines. In the same manner, for signal C four semiconductor elements, and for signal D eight semiconductor elements are respectively connected to alternate row lines so as to select output lines. However, as has been described above, there are also provided grounded lines in addition to the output lines, so that the number of the grounded lines increases in proportion to the number of the output lines, thereby increasing the percentage of the area occupied by the grounded lines.

Figure 21:
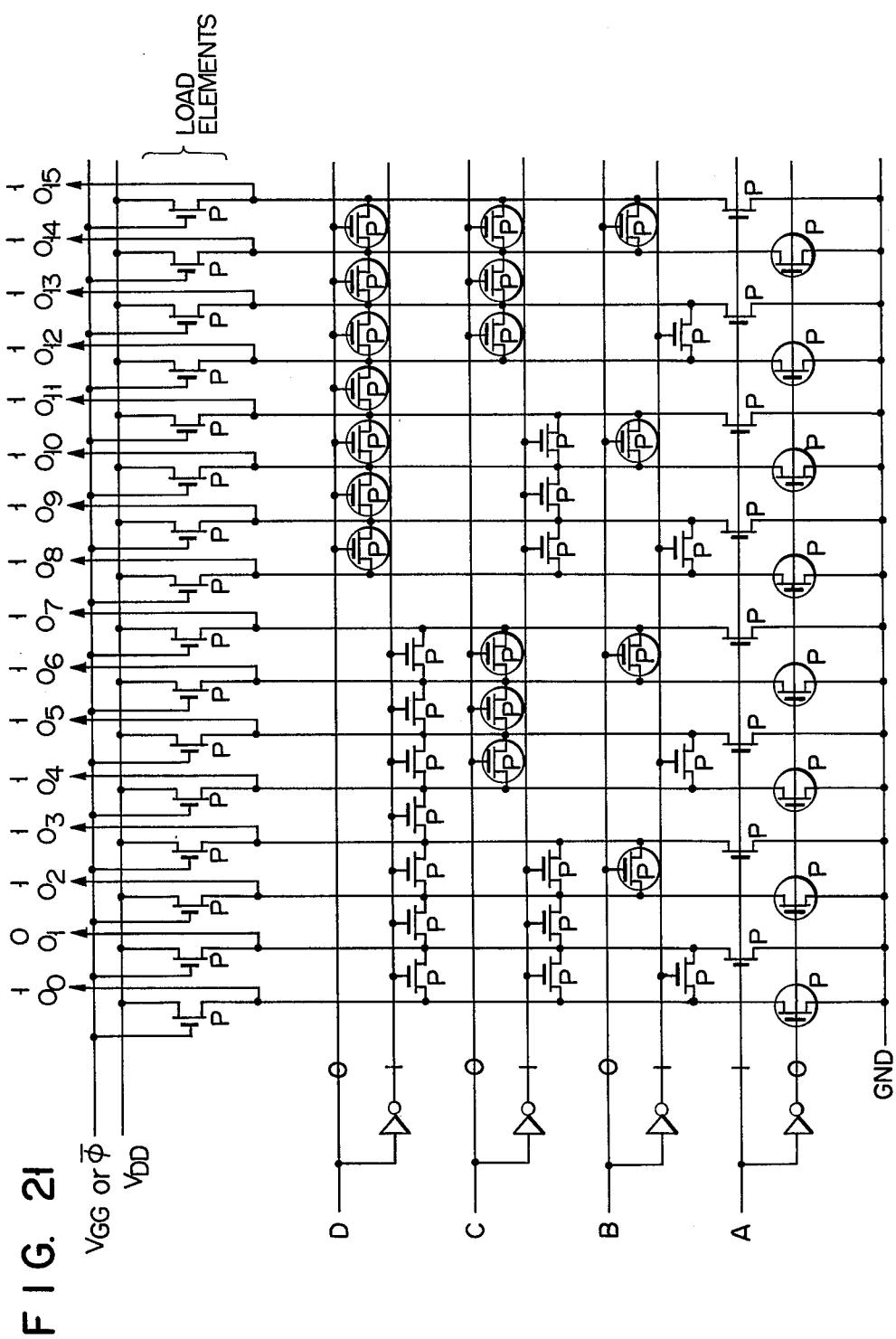
FIGS. 21 and 22 are diagrams useful to explain the operation of the modified decoder shown in FIG. 20.
Figure 22:
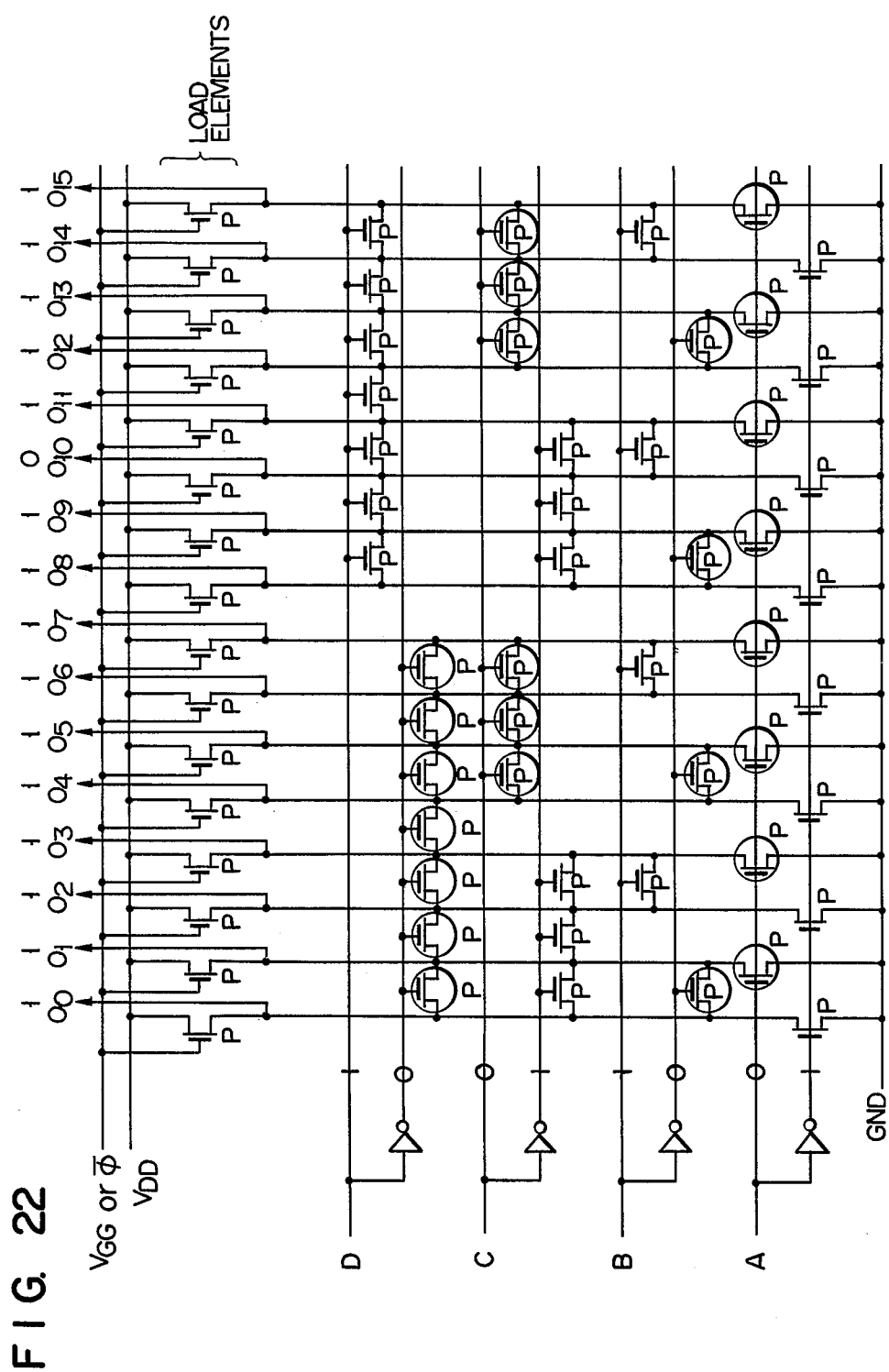
Figure 23:
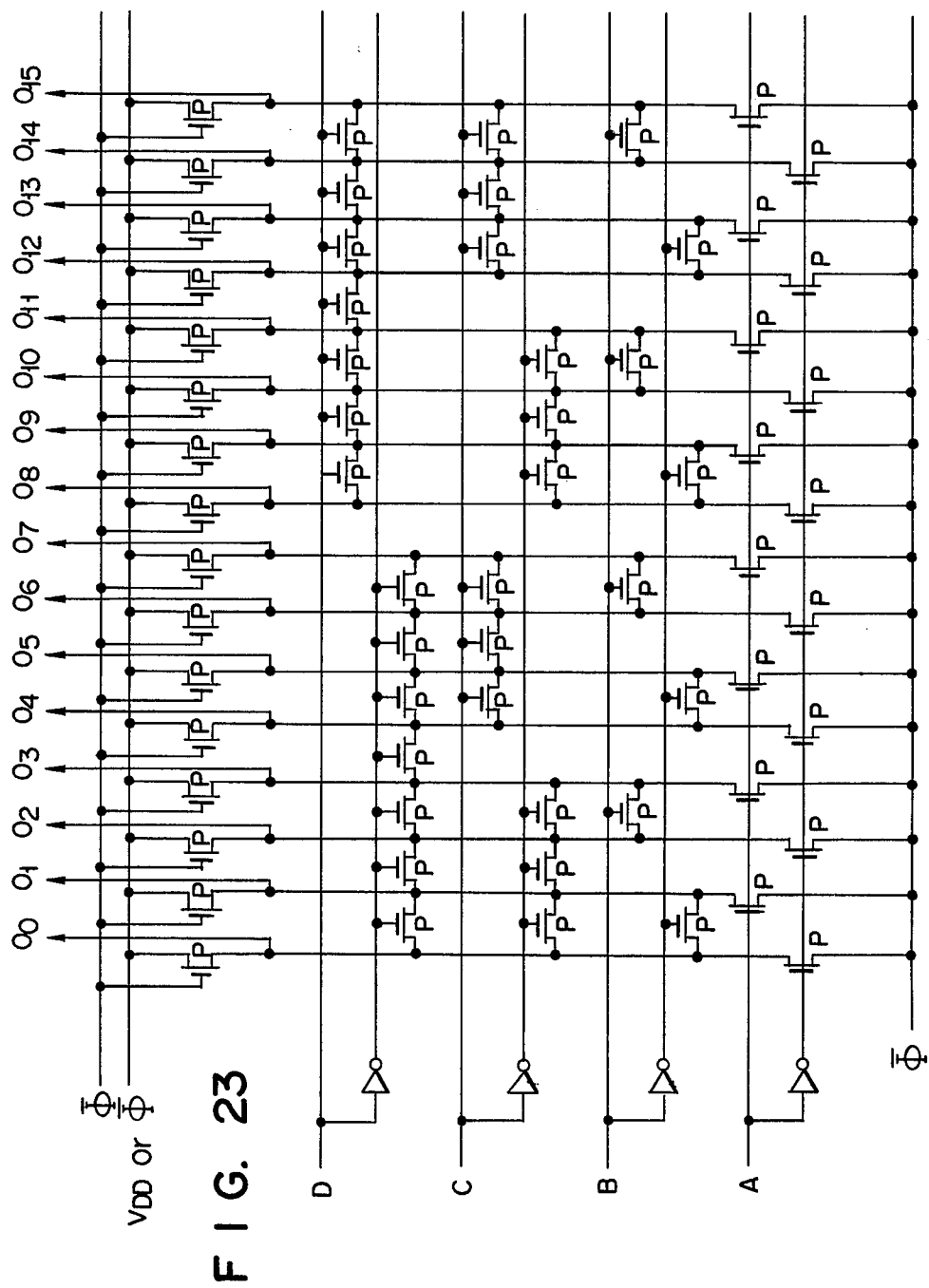
FIGS. 23 through 27 show various modifications of the decoder.
Figure 24:
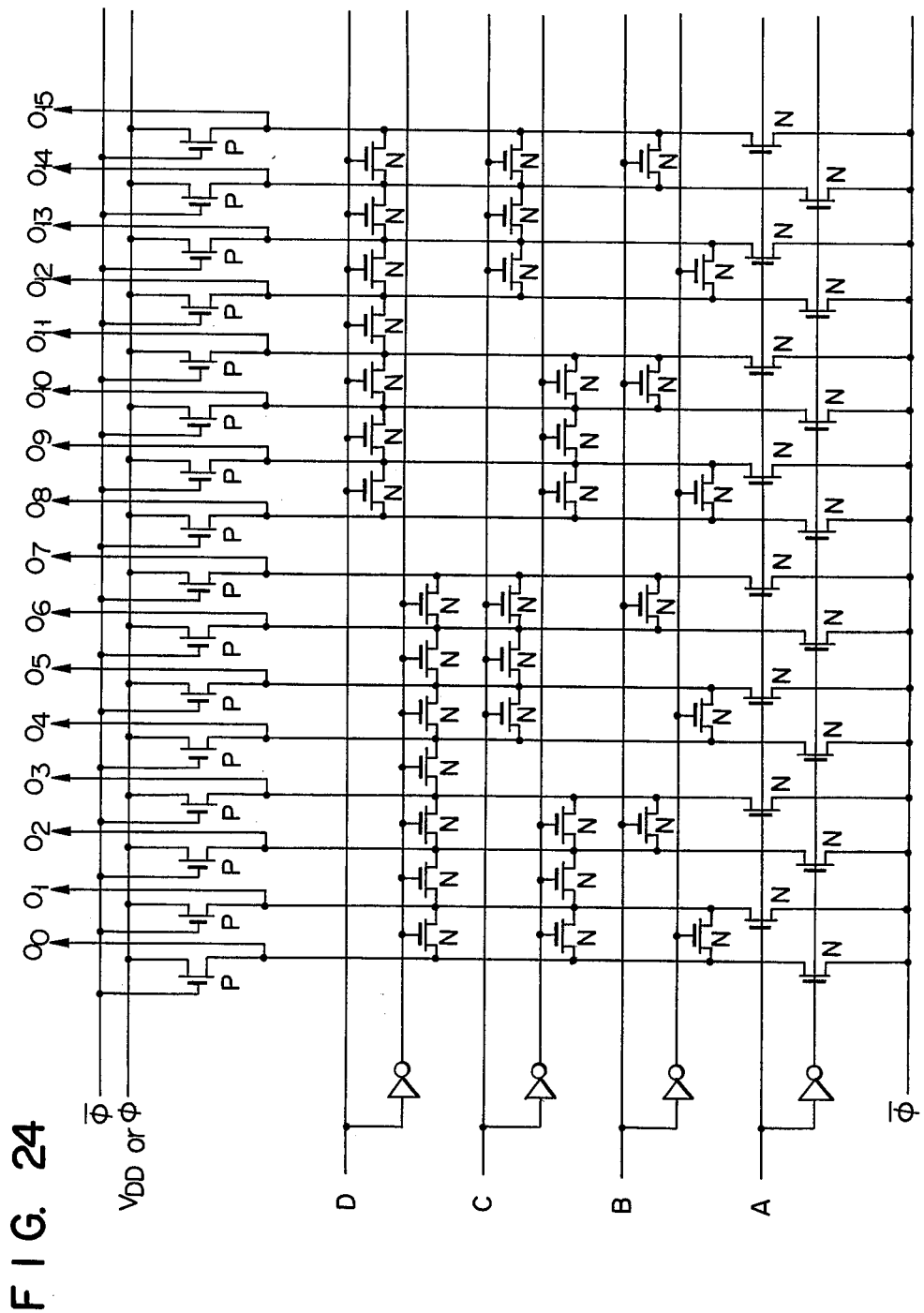

FIG. 20 shows the connection diagram of one embodiment of the matrix circuit of this invention, and FIGS. 21 and 22 are diagrams to explain the operation thereof. As shown in FIG. 20, load elements 11 are connected to source $V_{DD}$ and column lines 12 serving as the output lines. Logical operation signals A, B, C, and D in the form of binary codes are impressed upon respective row lines intersecting the column lines to form a matrix circuit. Inverters 14 are provided to impress "0" input signals to alternate row lines. Input signals A, B, C, and D correspond to binary code numbers 1, 2, 4 and 8 respectively, as before, for signal A corresponding to binary code 1, one semiconductor element is connected across row lines 13 connected to receive "1" and "0" level signals respectively to form an AND gate circuit. For signals B, C and D corresonding to binary code numbers 2, 4 and 8 respectively 1, 3 and 7 semiconductor elements smaller than 2, 4 and 8 by 1 respectively are connected across alternate row lines 13 connected to receive "1" and "0" level signals respectively. Semiconductor elements arranged at the cross-points of the same lines are adjacent each other for input signals C and D. Accordingly, at the cross-points for input signals B, C and D, different type logical operation circuits, that is OR gate circuits are formed. In addition, according to this invention, the column line 12 is connected to a grounded line 15 parallel to the row lines 13. Depending upon the type of the load elements 11, the load elements may be connected to a source of clock signals.

FIG. 21 shows another embodiment of this invention wherein logical operation signals at a 1000 level are used as inputs A, B, C and D. In this embodiment, the address of FIG. 20 corresponds to address 1 when logical operation signals A = "1" and B = C = D = "0" are applied output line $O_1$ will assume "0" level, whereas other output line will assume "1" level and are grounded whereby output line $O_1$ is selected. Semiconductor elements bounded by circles show that they are ON state.

FIG. 22 is a diagram showing an operation wherein the address of FIG. 20 is the 10th address and inputs of A = "0", B = "1", C = "0" and D = "1" are supplied to cause only output line $O_{10}$ to assume "0" level and the other output line "1" level. In this figure too, semiconductor elements bounded by circles are ON state. Thus the output line $O_{10}$ assuming the "0" level is selected while other output lines are grounded. As can be noted from the foregoing description the logic involved is a positive logic in which "1" level is the ground potential and "0" level is $-E$ volt.

Figure 25:
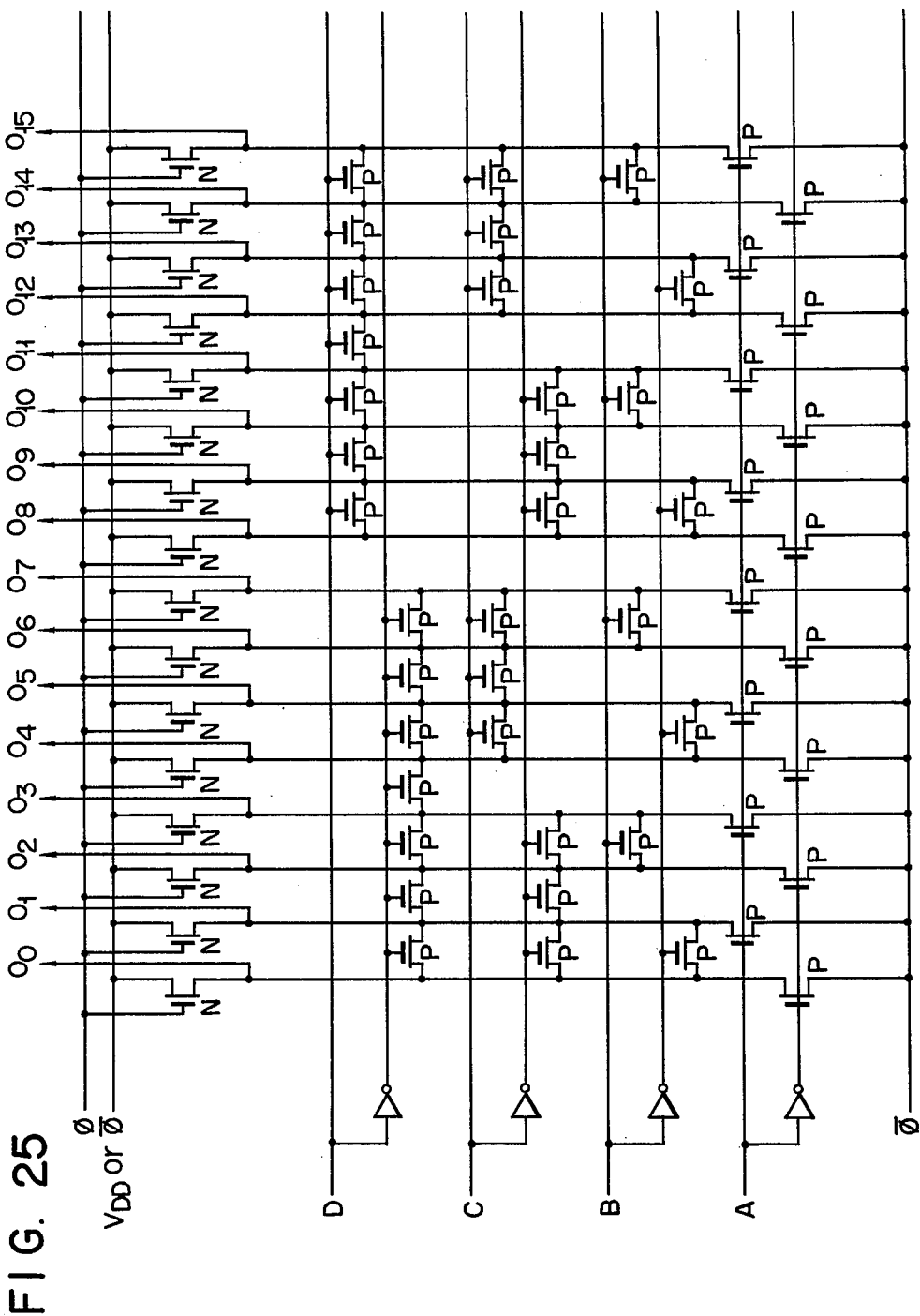
Figure 26:
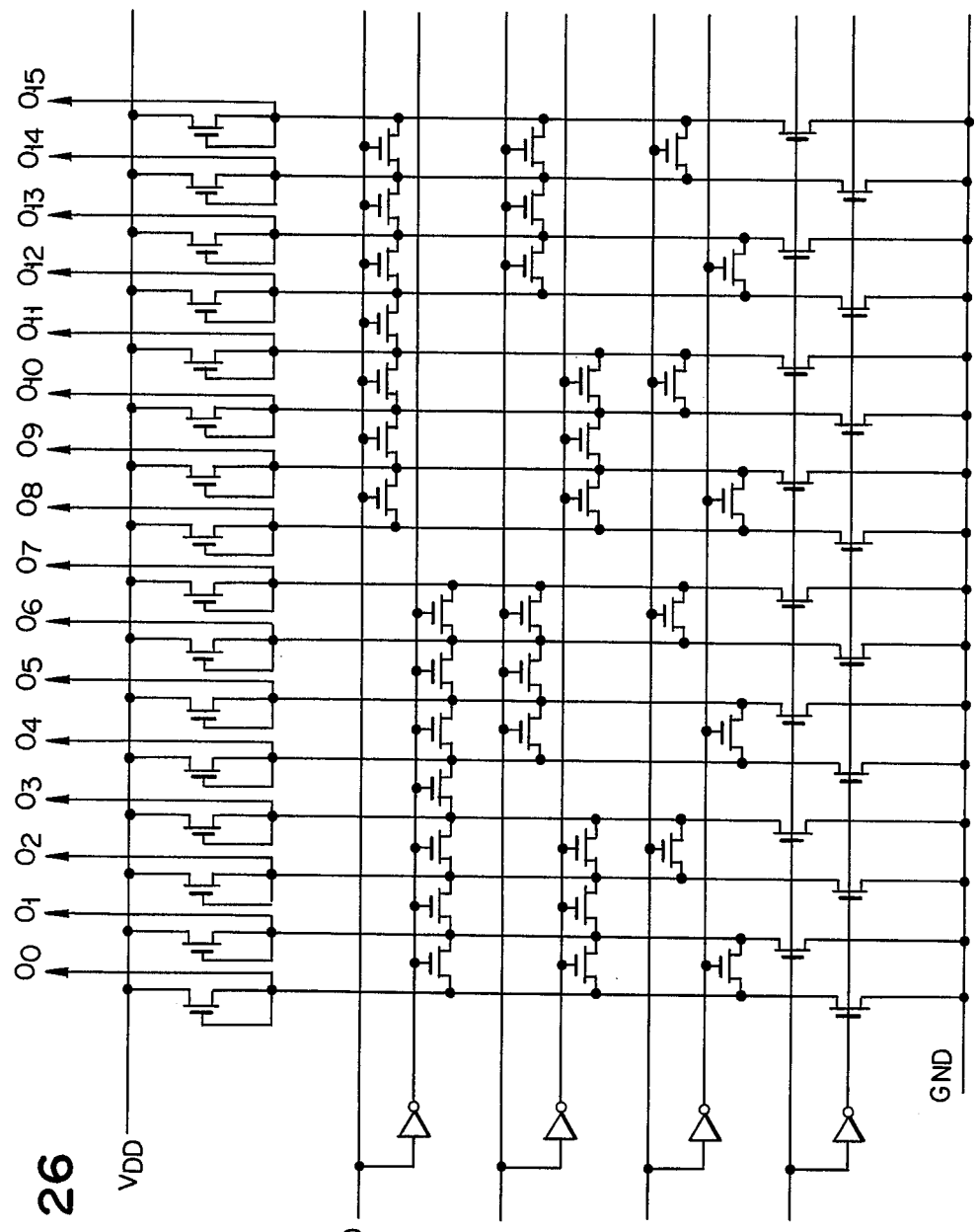
Figure 27:
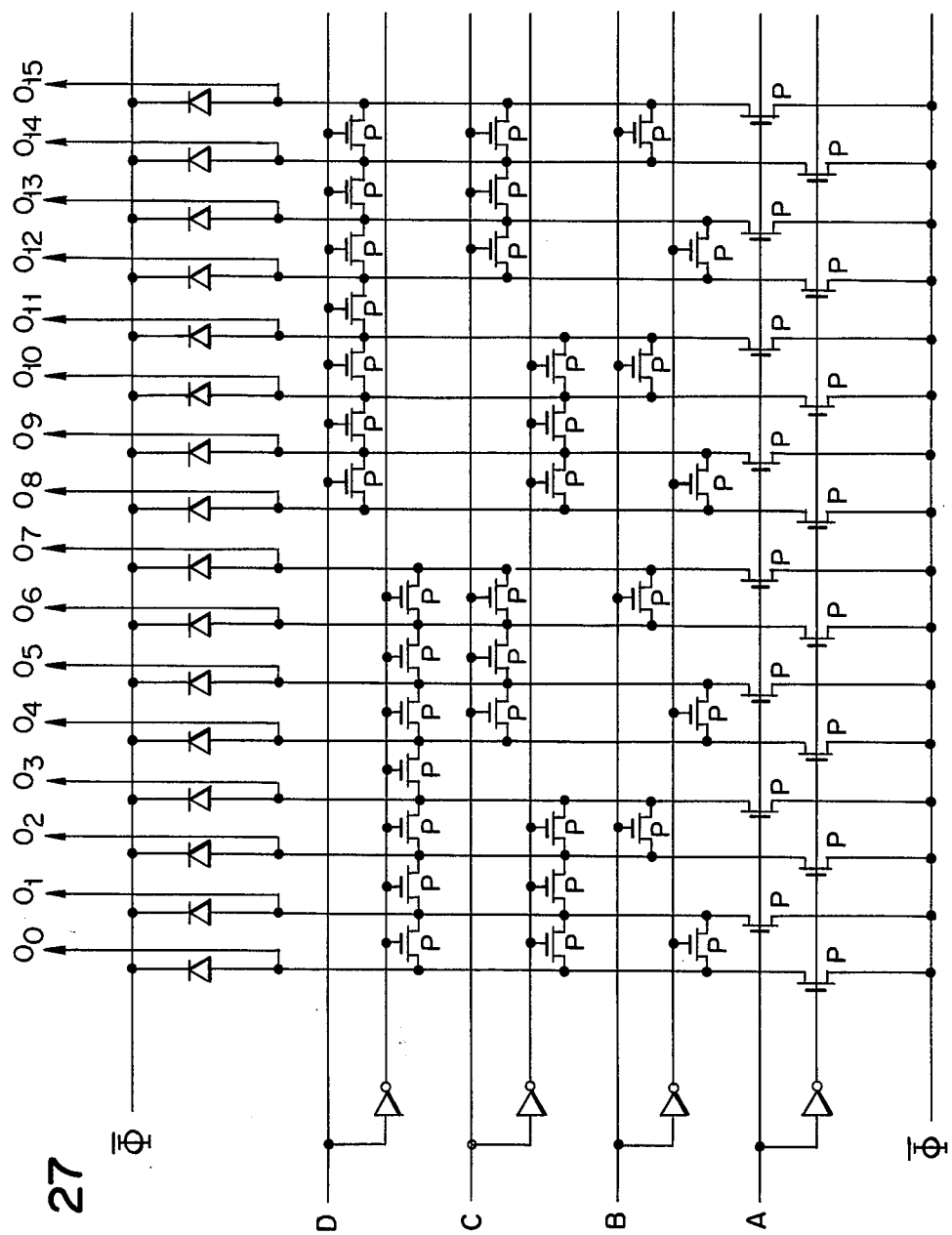

FIGS. 23 through 27 show another embodiments in which different types of the semiconductor elements and the load elements are used to form the matrix circuits. Thus, in FIG. 23 ratio-less type P channel MOS transistors are used to form the decoder, whereas in FIG. 24 conjugate type MOS transistors are used. FIGS. 25 shows a modification of the circuit shown in FIG. 24. In FIG. 26, depletion type semiconductor elements are used as the load elements, and enhance type semiconductor elements are used to constitute the logical operation circuits. In FIG. 27, diodes are used as the load elements, whereas P channel MOS transistors are used to constitute the decoder. Although in the foregoing embodiments, four types of the binary codes are used, it will be clear that the number of the types of the binary coded may be different from 4. Furthermore, it is possible to use bipolar transistors as the semiconductor elements and the load elements. Comparing the embodiments described above with the decoder shown in FIG. 19, it will be clearly noted that the number of the grounded lines is greatly reduced, and that the number of the semiconductor elements is reduced to 66 from 80 shown in FIG. 19, a reduction of 17.5%. Moreover, as it is not necessary to provide grounded conductors between adjacent output liens (source lines) as in the prior art and as the output lines are also used as gate lines and source lines, the occupation area can be greatly reduced thereby making it possible to fabricate the matrix circuit with integrated circuits. In addition, as adjacent output lines are grounded, it is possible to prevent cross-overs between wirings and complecated construction. Moreover, different from rectangular configuration of the prior art matrix circuit, the matrix circuit of this invention is square or approximately square thus requiring a smaller occupation area and making it easy to fabricate with integrated circuits.

What we claim is:

1. A read-only memory matrix circuit comprising:
   a first group of input lines, a second group of input lines, a third group of input lines and a plurality of groups of output lines intersecting the input lines of the first, second and third groups to form a matrix array,
   the third group of input lines being arranged in the matrix array between the first and second groups of input lines,
   each of the plurality of groups of output lines having a common terminal connected to one end of a power source and another common terminal connected to ground,
   a plurality of first switching elements, individual ones of the plurality of first switching elements being connected to respective output lines and being selectively driven by first input signals applied to the input lines forming said first group,
   a plurality of second switching elements, respective ones of which are driven by the same first input signals applied to the plurality of first switching elements and are connected to the output lines consecutively located next in the matrix array relative to the output lines in which the first switching elements are connected, and
   a plurality of third switching elements, individual ones of which form different combinations connected between adjacent output lines and are selectively driven by second input signals applied to the third group of input lines.

2. A matrix circuit according to claim 1 wherein said common terminal of each of the plurality of groups of output lines is connected to the one end of the power source through a wired-OR connection.

3. A matrix circuit according to claim 1 wherein the matrix circuit further comprises at least one further output line arranged at one end portion of the matrix array constituted by said plurality of groups of output lines and adapted to be used only as a ground line.

4. A matrix circuit according to claim 1 wherein said common terminal of each of the plurality of groups of output lines is connected to the power source through a load MOS element of one conductivity type channel, said first, second and third switching elements are MOS FET elements of another conductivity type channel, and clock pulse signals are supplied between the common terminal and ground.

5. A matrix circuit according to claim 1 wherein said common terminal of each of the plurality of groups of output lines is connected to the power source through a diode.

6. A matrix circuit according to claim 1 wherein said common terminal of each of the plurality of groups of output lines is connected to the power source through a resistor.

* * * * *